US008295091B2

(12) United States Patent
Itagaki et al.

(10) Patent No.: US 8,295,091 B2
(45) Date of Patent: Oct. 23, 2012

(54) NONVOLATILE SEMICONDUCTOR MEMORY DEVICE

(75) Inventors: Kiyotaro Itagaki, Naka-gun (JP); Yoshiaki Fukuzumi, Yokohama (JP); Yoshihisa Iwata, Yokohama (JP); Ryota Katsumata, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 227 days.

(21) Appl. No.: 12/846,234

(22) Filed: Jul. 29, 2010

(65) Prior Publication Data

US 2011/0235421 A1    Sep. 29, 2011

(30) Foreign Application Priority Data

Mar. 23, 2010 (JP) ................... 2010-066938

(51) Int. Cl.
*G11C 16/04* (2006.01)
(52) U.S. Cl. .......... 365/185.17; 365/185.02; 365/185.18
(58) Field of Classification Search ............. 365/185.17, 365/185.02, 185.18
See application file for complete search history.

(56) References Cited

U.S. PATENT DOCUMENTS

| 7,715,194 | B2 | 5/2010 | Brewer et al. | |
| 8,107,286 | B2 * | 1/2012 | Itagaki et al. | ............ 365/185.02 |
| 2007/0252201 | A1 | 11/2007 | Kito et al. | |
| 2009/0294844 | A1 * | 12/2009 | Tanaka et al. | ............ 257/330 |
| 2010/0172189 | A1 | 7/2010 | Itagaki et al. | |

FOREIGN PATENT DOCUMENTS

| JP | 06-325580 | 11/1994 |
| JP | 2007-266143 | 10/2007 |
| JP | 2008-305536 | 12/2008 |
| JP | 2009-146942 | 7/2009 |
| JP | 2009-146954 | 7/2009 |
| WO | WO 2009/075370 A1 | 6/2009 |

OTHER PUBLICATIONS

Hiroshi Sakuraba et al., "New Three-Dimensional High-Density Stacked-Surrounding Gate Transistor (S-SGT) Flash Memory Architecture Using Self-Aligned Interconnection Fabrication Technology without Photolithography Process for Tera-Bits and Beyond", Japanese Journal of Applied Physics, vol. 43, No. 4B, 2004, 3 pages.
Yosuke Komori et al., "Disturbless Flash Memory due to High Boost Efficiency on BiCS Structure and Optimal Memory Film Stack for Ultra High Density Storage Device", IEDM Tech. Dig., Dec. 2008, 4 pages.
Office Action issued Jul. 3, 2012 in Japanese Patent Application No. 2010-066938 filedMar. 23, 2010 (with English translation).
U.S. Appl. No. 12/886,854, filed Sep. 21, 2010, Fukuzumi, et al.
U.S. Appl. No. 12/846,234, filed Jul. 29, 2010, Itagaki, et al.
U.S. Appl. No. 13/091,589, filed Apr. 21, 2011, Iguchi, et al.

* cited by examiner

*Primary Examiner* — Connie Yoha
(74) *Attorney, Agent, or Firm* — Oblon, Spivak, McClelland, Maier & Neustadt, L.L.P.

(57) ABSTRACT

According to one embodiment, in the case of performing an operation for increasing a threshold voltage of a first transistor or a third transistor, a control circuit is configured to apply a first voltage to a bit line, and apply a second voltage greater than the first voltage to a gate of a second transistor, thereby rendering the second transistor in a conductive state to transfer the first voltage to a second semiconductor layer, and then apply a program voltage to a gate of the first transistor or the third transistor to store a charge in a second charge storage layer.

19 Claims, 30 Drawing Sheets

FIG. 9 [S101] Setting Threshold Voltage of SDTr2 and SSTr2 to Positive Potential FIG. 22 [S106] Setting Threshold Voltage of SDTr2 to Negative Potential

US 8,295,091 B2

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2010-066938, filed on Mar. 23, 2010, the entire contents of which are incorporated herein by reference.

BACKGROUND

1. Field

Embodiments described herein relates to an electrically data-rewritable nonvolatile semiconductor memory device.

2. Description of the Related Art

As miniaturization technology approaches its limit, much is expected from stacking of memory cells as a way of improving bit density in nonvolatile semiconductor memory devices such as NAND flash memory. As an example, there is proposed a stacking-type NAND flash memory configured by a memory cell using a vertical-type transistor. The stacking-type NAND flash memory includes a memory string comprising a plurality of memory cells connected in series in the stacking direction, and select transistors provided at both ends of the memory string.

This stacking-type NAND flash memory has a large number of memory strings connected to one bit line and the select transistors are thus required to have excellent cutoff characteristics. At the same time, the manufacturing processes are also required to be simplified and the manufacturing costs kept low. In addition, power consumption is also required to be kept low. It is highly expected that a stacking-type NAND flash memory comprising select transistors simultaneously fulfilling these three different requirements is proposed.

DETAILED DESCRIPTION

Figure 1:
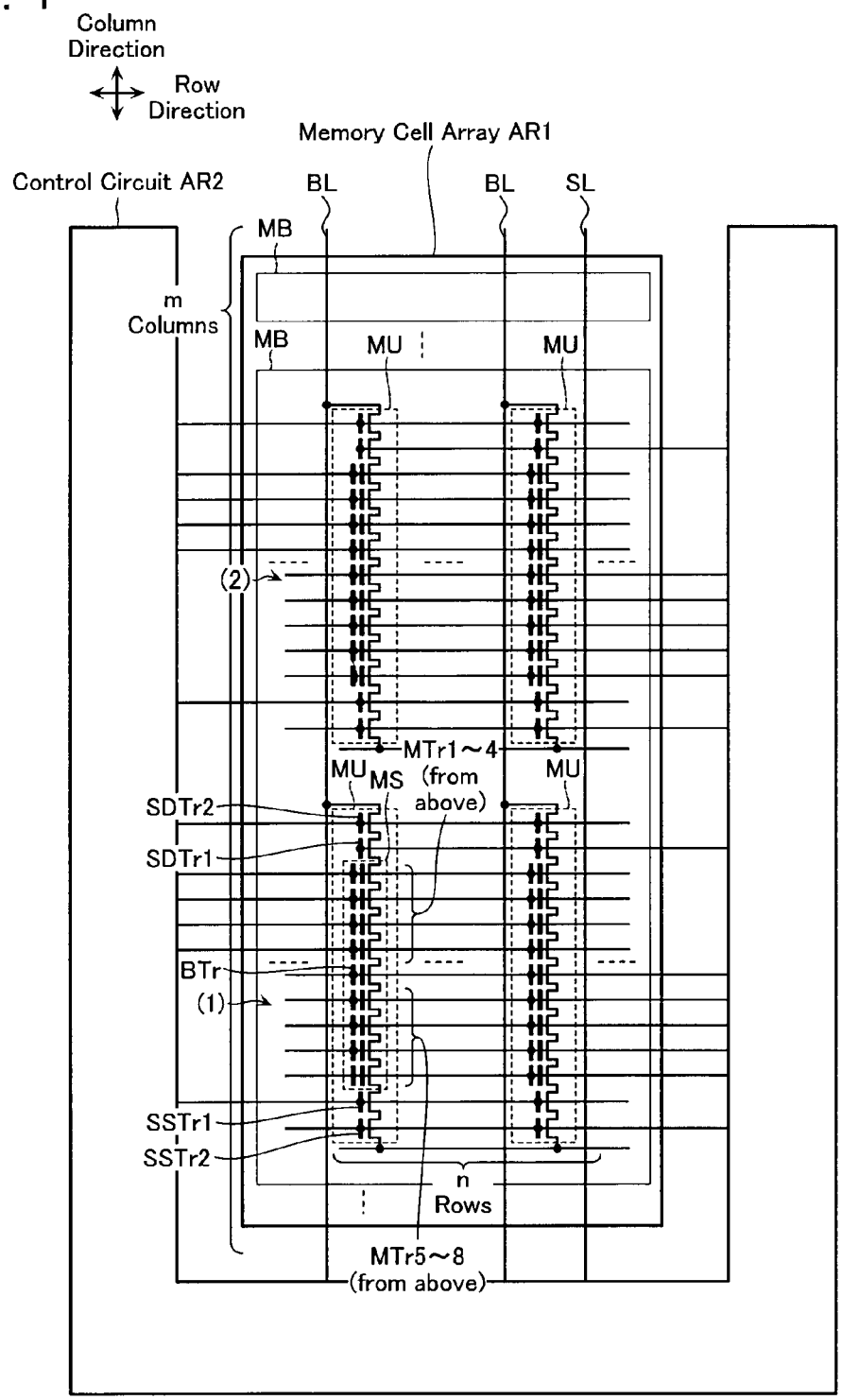
FIG. 1 is a circuit diagram of a nonvolatile semiconductor memory device in accordance with a first embodiment.

According to one embodiment, a nonvolatile semiconductor memory device comprises a plurality of memory strings, a first transistor, a second transistor, a third transistor, a fourth transistor, a bit line, a source line, and a control circuit. The memory strings each includes a plurality of memory transistors connected in series. The first transistor has one end connected to one end of one of the memory strings and functions as a drain side select transistor of the one of the memory strings. The second transistor has one end connected to the other end of the first transistor. The third transistor has one end connected to the other end of the one of the memory strings and functions as a source side select transistor of the one of the memory strings. The fourth transistor has one end connected to the other end of the third transistor. The bit line is connected to the other end of the second transistor. The source line is connected to the other end of the fourth transistor. The control circuit is configured to control a state of the memory strings, the first transistor, the second transistor, the third transistor, and the fourth transistor. Each of the memory strings comprises a first semiconductor layer, a first charge storage layer, and a first conductive layer. The first semiconductor layer includes a first columnar portion extending in a perpendicular direction with respect to a substrate and functions as a body of the memory transistors. The first charge storage layer surrounds the first columnar portion and changes a threshold voltage of the memory transistors by storing a charge. The first conductive layer surrounds the first columnar portion with the first charge storage layer sandwiched therebetween, extends in parallel to the substrate, and functions as a gate of the memory transistors. The first through fourth transistors each comprises a second semiconductor layer, a second charge storage layer, and a second conductive layer. The second semiconductor layer includes a second columnar portion extending in the perpendicular direction with respect to the substrate and functions as a body of the first through fourth transistors. The second charge storage layer surrounds the second columnar portion and changes a threshold voltage of the first through fourth transistors by storing a charge. The second conductive layer surrounds the second columnar portion with the second charge storage layer sandwiched therebetween, extends in parallel to the substrate, and functions as a gate of the first through fourth transistors. In the case of performing an operation for increasing the threshold voltage of the first transistor or the third transistor, the control circuit is configured to apply a first voltage to the bit line, and apply a second voltage greater than the first voltage to a gate of the second transistor, thereby rendering the second transistor in a conductive state to transfer the first voltage to the second semiconductor layer. Then the control circuit is configured to apply a program voltage to a gate of the first transistor or the third transistor to store a charge in the second charge storage layer. In the case of leaving the threshold voltage of the first transistor or the third transistor unincreased, the control circuit is configured to apply the second voltage to the bit line, and apply the second voltage to the gate of the second transistor, thereby charging the first semiconductor layer and the second semiconductor layer to a certain voltage from the bit line via the second transistor and subsequently renders the second transistor in a non-conductive state to maintain the first semiconductor layer and the second semiconductor layer in a floating state. Then, the control circuit is configured to apply the program voltage to the gate of the first transistor or the third transistor to increase a voltage of the second semiconductor layer through coupling, thereby prohibiting storage of charge in the second charge storage layer.

According to one embodiment, a nonvolatile semiconductor memory device comprises a plurality of memory strings, a first transistor, a second transistor, a third transistor, a fourth transistor, a bit line, a source line, and a control circuit. The memory strings each includes a plurality of memory transistors connected in series. The first transistor has one end connected to one end of one of the memory strings and functions as a drain side select transistor of the one of the memory strings. The second transistor has one end connected to the other end of the first transistor. The third transistor has one end connected to the other end of the one of the memory strings and functions as a source side select transistor of the one of the memory strings. The fourth transistor has one end connected to the other end of the third transistor. The bit line is connected to the other end of the second transistor. The source line is connected to the other end of the fourth transistor. The control circuit is configured to control a state of the memory strings, the first transistor, the second transistor, the third transistor, and the fourth transistor. Each of the memory strings comprises a first semiconductor layer, a first charge storage layer, and a first conductive layer. The first semiconductor layer includes a first columnar portion extending in a perpendicular direction with respect to a substrate and functions as a body of the memory transistors. The first charge storage layer surrounds the first columnar portion and changes a threshold voltage of the memory transistors by storing a charge. The first conductive layer surrounds the first columnar portion with the first charge storage layer sandwiched therebetween, extends in parallel to the substrate, and functions as a gate of the memory transistors. The first through fourth transistors each comprises a second semiconductor layer, a second charge storage layer, and a second conductive layer. The second semiconductor layer includes a second columnar portion extending in the perpendicular direction with respect to the substrate and functions as a body of the first through fourth transistors. The second charge storage layer surrounds the second columnar portion and changes a threshold voltage of the first through fourth transistors by storing a charge. The second conductive layer surrounds the second columnar portion with the second charge storage layer sandwiched therebetween, extends in parallel to the substrate, and functions as a gate of the first through fourth transistors. Prior to executing the operation for increasing the threshold voltage of the first transistor or the third transistor, the control circuit is configured to increase the threshold voltage of the second transistor and the fourth transistor from a negative voltage to a positive voltage.

Embodiments of a nonvolatile semiconductor memory device are described below with reference to the drawings.

[First Embodiment]

First, an overall configuration of a nonvolatile semiconductor memory device in accordance with a first embodiment is described with reference to FIG. 1. FIG. 1 is a circuit diagram of the nonvolatile semiconductor memory device in accordance with the first embodiment.

As shown in FIG. 1, the nonvolatile semiconductor memory device in accordance with the first embodiment includes a memory cell array AR1 and a control circuit AR2 provided at a periphery of the memory cell array AR1.

As shown in FIG. 1, the memory cell array AR1 is configured having a plurality of memory strings MS arranged therein, each of the memory strings MS having electrically rewritable memory transistors MTr1-MTr8 (memory cells) connected in series. The control circuit AR2 is configured by various kinds of control circuits configured to control a voltage applied to a gate and so on of the memory transistors MTr (MTr1-MTr8). The control circuit AR2 executes a write operation for writing data to the memory transistors MTr, an erase operation for erasing data in the memory transistors MTr, and a read operation for reading data from the memory transistors MTr. During the write operation and the read operation, a voltage applied to a selected memory string MS is substantially similar to a conventional stacking-type flash memory.

As shown in FIG. 1, the memory cell array AR1 includes m columns of memory blocks MB. Each memory block MB includes n rows by 2 columns of memory units MU. The memory unit MU comprises the memory string MS, a first source side select transistor SSTr1 and a second source side select transistor SSTr2 connected in series to a source side of the memory string MS, and a first drain side select transistor SDTr1 and a second drain side select transistor SDTr2 connected in series to a drain side of the memory string MS. Note that, in the example shown in FIG. 1, a first column of the memory units MU is labeled (1), and a second column of the memory units MU is labeled (2). Two memory units MU aligned in a column direction in each of the memory blocks MB share a bit line BL. In addition, n memory units MU aligned in a row direction in each of the memory blocks MB share word lines, select gate lines, a source line, and a back gate line. The bit line BL and a source line SL are shared by the m columns of memory blocks MB.

Figure 2:
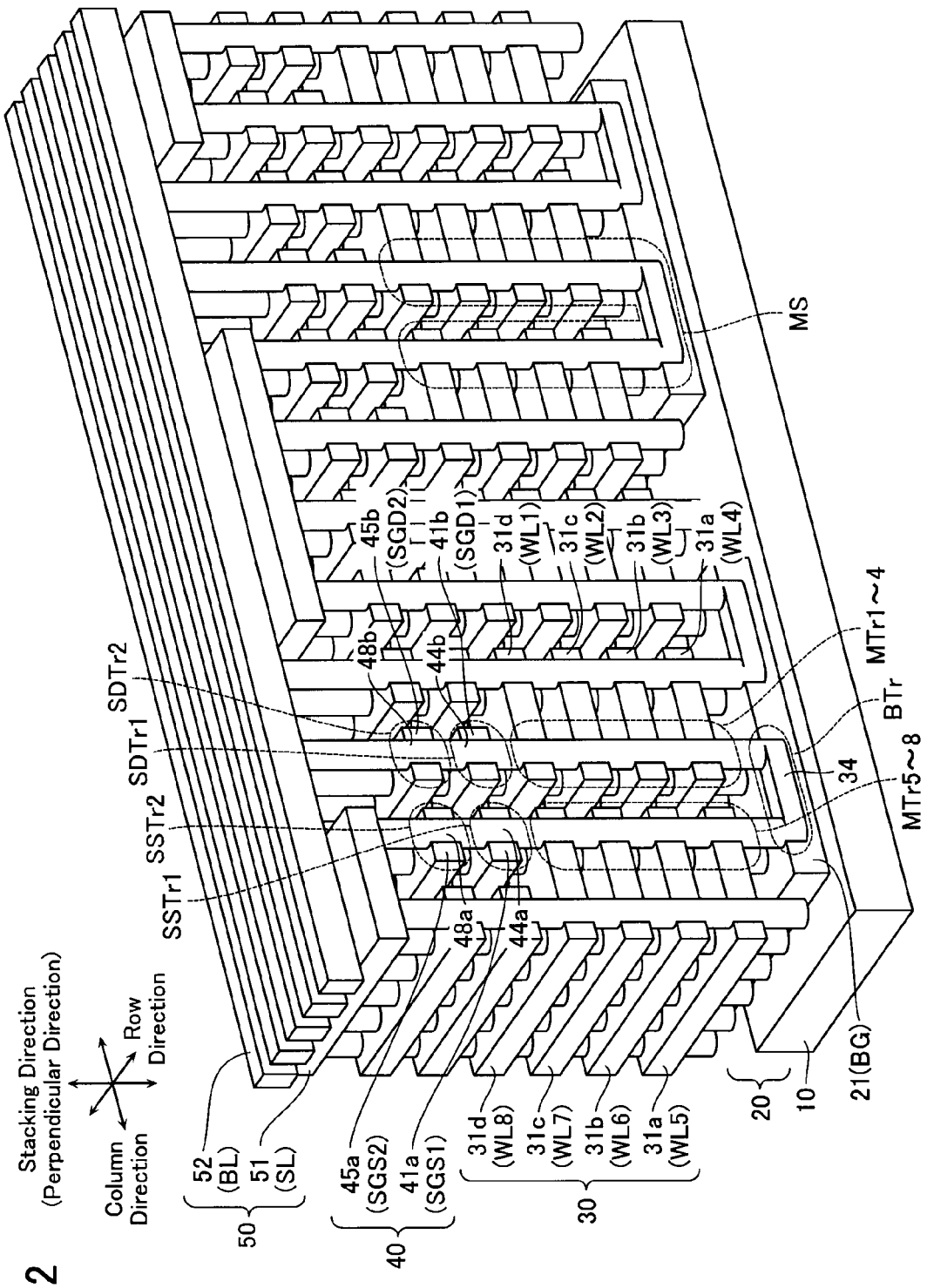
FIG. 2 is a perspective view showing a stacking structure of a memory cell array AR1 in accordance with the first embodiment.

As shown in FIG. 2, the memory cell array AR1 is configured to have the electrically data-storing memory transistors MTr arranged in a three-dimensional matrix. That is, as well as being arranged in a matrix in a horizontal direction, the memory transistors MTr are arranged also in a stacking direction (a perpendicular direction with respect to a substrate). A plurality of the memory transistors MTr1-MTr8 lined up in the stacking direction are connected in series to configure the aforementioned memory string MS. The first and second drain side select transistors SDTr1 and SDTr2, and the first and second source side select transistors SSTr1 and SSTr2, which are rendered conductive when selected, are connected to the two ends of the memory string MS, respectively. The memory string MS is arranged to be long in the stacking direction. Note that a detailed stacking structure is described hereafter.

Figure 3:
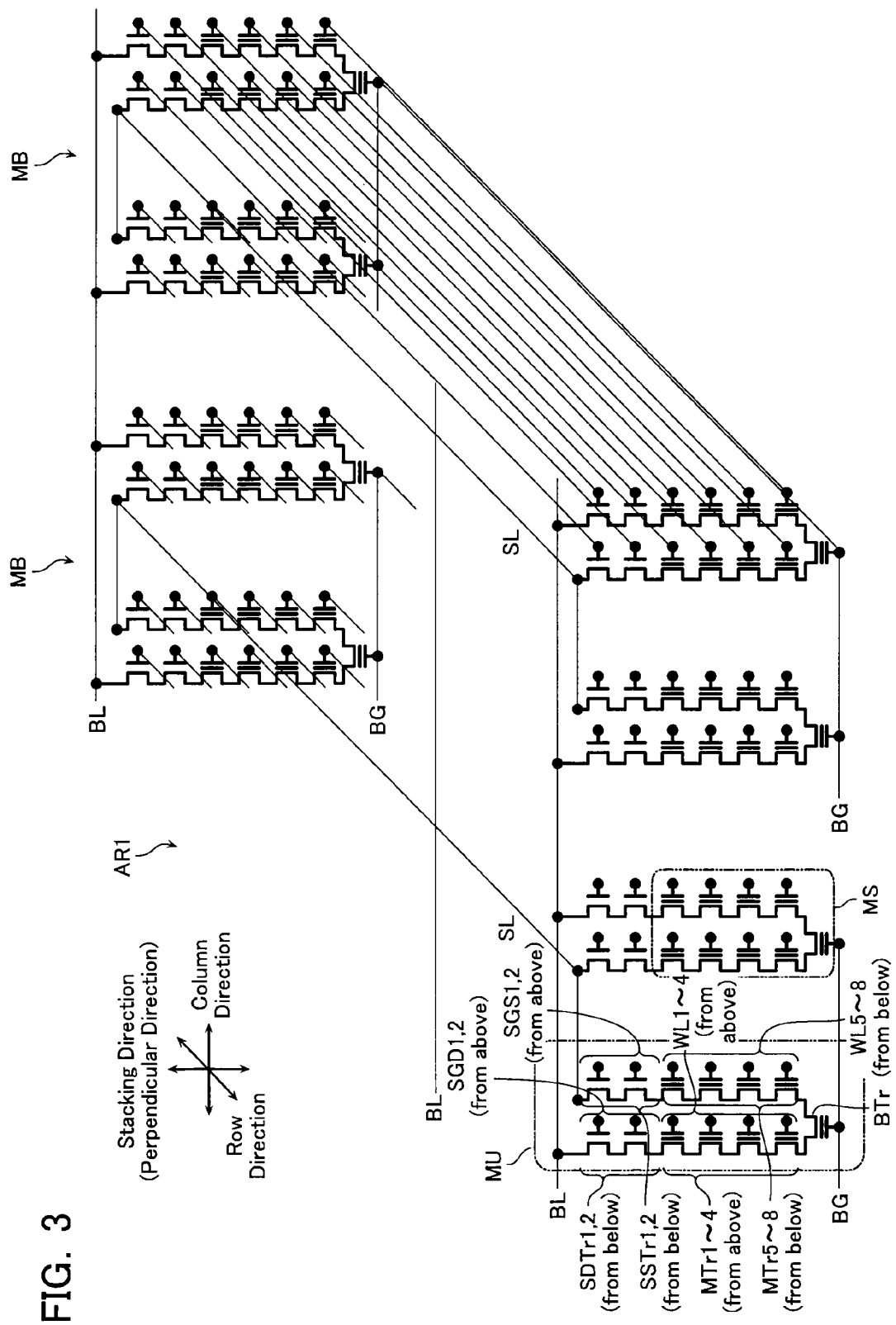
FIG. 3 is an equivalent circuit diagram of the memory cell array AR1.

Next, a circuit configuration of the memory cell array AR1 is described specifically with reference to FIG. 3. FIG. 3 is an equivalent circuit diagram of the memory cell array AR1.

As shown in FIG. 3, the memory cell array AR1 includes a plurality of the bit lines BL and a plurality of the memory blocks MB. The bit lines BL are formed in stripes extending with the column direction as a long direction and arranged with a certain pitch in the row direction. The memory blocks MB are provided repeatedly in the column direction with a certain pitch.

As shown in FIG. 3, the memory block MB includes a plurality of the memory units MU arranged in a matrix in the row direction and the column direction. In the memory block MB, one bit line BL is provided with the plurality of the memory units MU which are commonly connected. The memory unit MU includes the memory string MS, the first source side select transistor SSTr1 and the second source side select transistor SSTr2, and the first drain side select transistor SDTr1 and the second drain side select transistor SDTr2. The memory units MU are arranged in a matrix in the row direction and the column direction.

The memory string MS is configured by the memory transistors MTr1-MTr8 and a back gate transistor BTr connected in series. The memory transistors MTr1-MTr4 are connected in series in the stacking direction. The memory transistors MTr5-MTr8 also are similarly connected in series in the stacking direction. The memory transistors MTr1-MTr8 change a threshold voltage by changing an amount of charge stored in a charge storage layer. Data retained by the memory transistors MTr1-MTr8 can be overwritten by changing the threshold voltage. The back gate transistor BTr is connected between transistors MTr4 and MTr5 at the lowermost layer memory. The memory transistors MTr1-MTr8 and the back gate transistor BTr are thus connected in a U shape in a cross-section in the column direction. A drain of the first source side select transistor SSTr1 is connected to one end of the memory string MS (a source of the memory transistor MTr8). A drain of the second source side select transistor SSTr2 is connected to a source of the first source side select transistor SSTr1. A source of the first drain side select transistor SDTr1 is connected to the other end of the memory string MS (a drain of the memory transistor MTr1). A source of the second drain side select transistor SDTr2 is connected to a drain of the first drain side select transistor SDTr1. These transistors SSTr1 and SSTr2, and SDTr1 and SDTr2 have differing threshold voltages by changing an amount of charge stored in a respective charge storage layer.

Gates of the n memory transistors MTr1 in the memory units MU arranged in a line in the row direction are commonly connected to a word line WL1 extending in the row direction. Similarly, gates of the n memory transistors MTr2-MTr8 respectively arranged in lines in the row direction are commonly connected to respective word lines WL2-WL8 extending in the row direction. Moreover, gates of the 2×n back gate transistors BTr arranged in a matrix in the row direction and the column direction are commonly connected to a back gate line BG.

Gates of the n first source side select transistors SSTr1 arranged in a line in the row direction are commonly connected to a first source side select gate line SGS1 extending in the row direction. Similarly, gates of the n second source side select transistors SSTr2 arranged in a line in the row direction are commonly connected to a second source side select gate line SGS2 extending in the row direction. Moreover, sources of the second source side select transistors SSTr2 are connected to the source line SL extending in the row direction.

Gates of the n first drain side select transistors SDTr1 arranged in a line in the row direction are commonly connected to a first drain side select gate line SGD1 extending in the row direction. Similarly, gates of the n second drain side select transistors SDTr2 arranged in a line in the row direction are commonly connected to a second drain side select gate line SGD2 extending in the row direction. Moreover, drains of the second drain side select transistors SDTr2 are connected to the bit line BL extending in the column direction.

Figure 4:
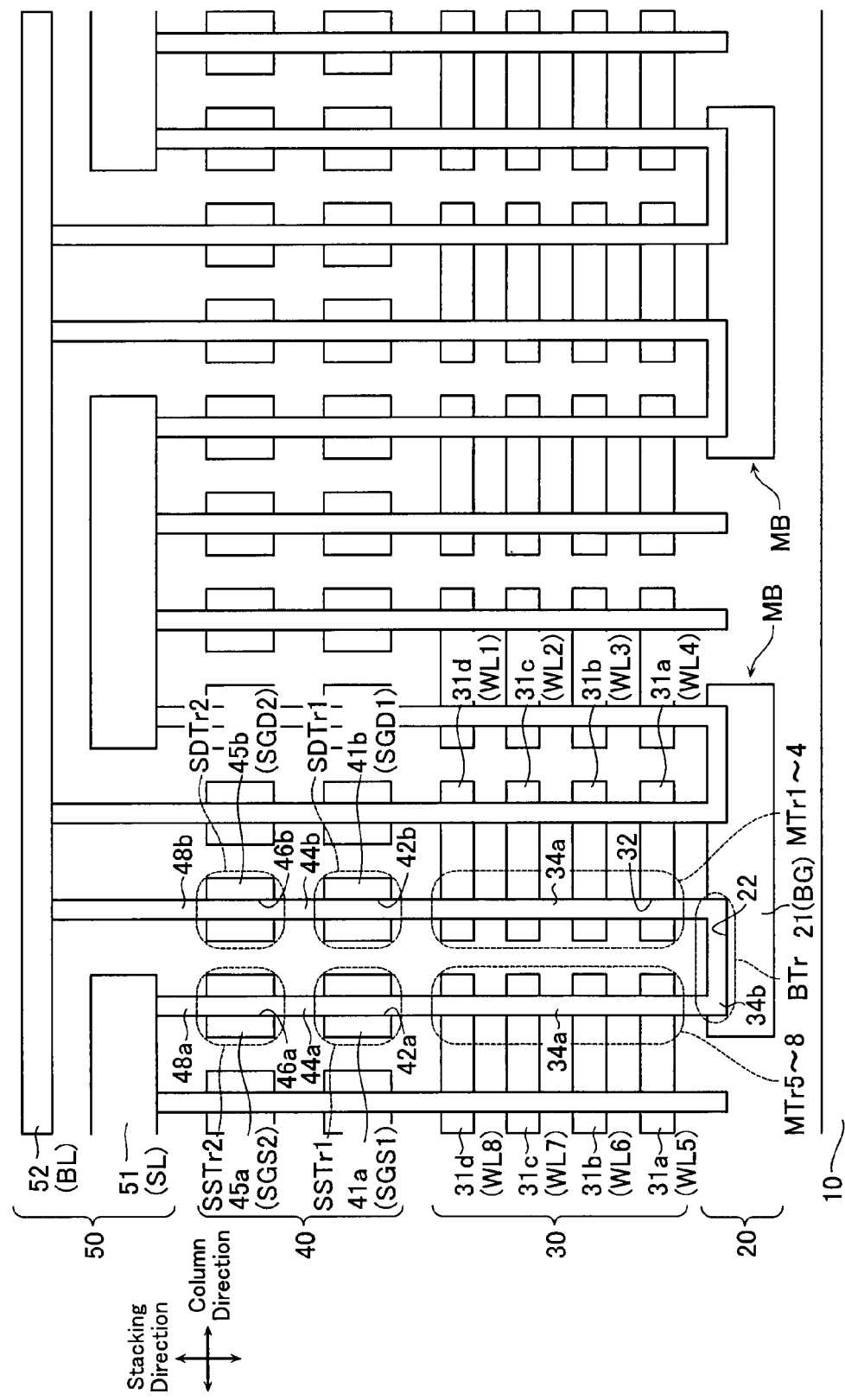
FIG. 4 is a cross-sectional view of the memory cell array AR1.
Figure 5:
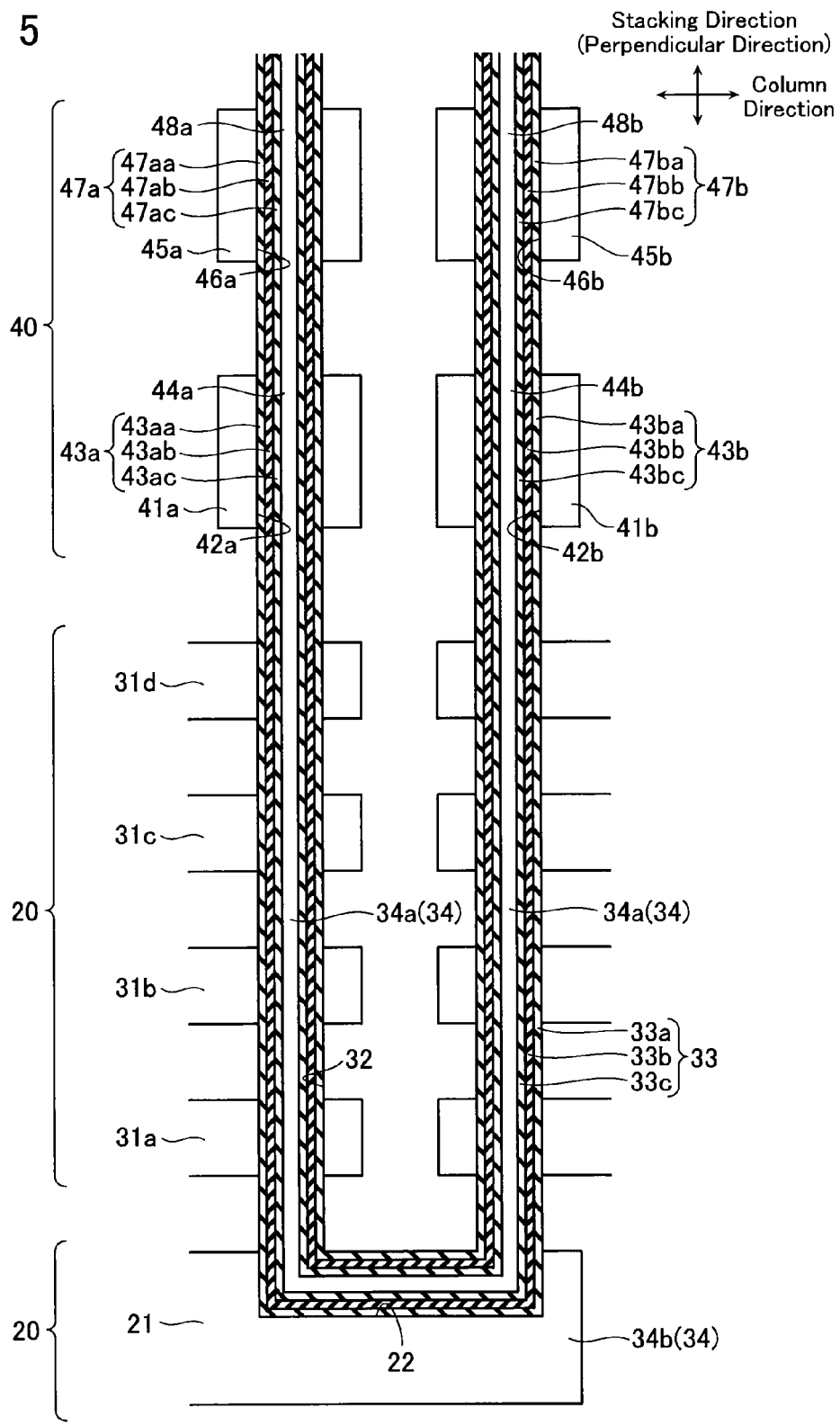
FIG. 5 is a partial enlarged view of FIG. 4.

Next, the stacking structure of the nonvolatile semiconductor memory device in accordance with the first embodiment is described with reference to FIGS. 4 and 5. FIG. 4 is a cross-sectional view of the memory cell array AR1, and FIG. 5 is a partial enlarged view of FIG. 4.

As shown in FIG. 4, the memory cell array AR1 includes, on a substrate 10, a back gate transistor layer 20, a memory transistor layer 30, a select transistor layer 40, and a wiring layer 50. The back gate transistor layer 20 functions as the back gate transistor BTr. The memory transistor layer 30 functions as the memory transistors MTr1-MTr8 (memory string MS). The select transistor layer 40 functions as the first source side select transistor SSTr1 and second source side select transistor SSTr2, and the first drain side select transistor SDTr1 and second drain side select transistor SDTr2. The wiring layer 50 functions as the source line SL and the bit line BL.

The back gate transistor layer 20 includes a back gate conductive layer 21, as shown in FIG. 4. The back gate conductive layer 21 functions as the back gate line BG and also functions as a gate of the back gate transistor BTr.

The back gate conductive layer 21 is formed extending two-dimensionally in the row direction and the column direction parallel to the substrate 10. The back gate conductive layer 21 is divided on the basis of memory blocks MB. The back gate conductive layer 21 is constituted by polysilicon (poly-Si).

The back gate transistor layer 20 includes a back gate hole 22, as shown in FIG. 4. The back gate hole 22 is formed so as to dig out the back gate conductive layer 21. The back gate hole 22 is formed in a substantially rectangular shape long in the column direction as viewed from an upper surface. The back gate holes 22 are formed in a matrix in the row direction and the column direction.

The memory transistor layer 30 is formed in a layer above the back gate transistor layer 20, as shown in FIG. 4. The memory transistor layer 30 includes word line conductive layers 31a-31d. The word line conductive layers 31a-31d function as the word lines WL1-WL8 and also function as the gates of the memory transistors MTr1-MTr8, respectively.

The word line conductive layers 31a-31d are stacked sandwiching interlayer insulating layers (not shown) therebetween. The word line conductive layers 31a-31d are formed extending with the row direction as a long direction and having a certain pitch in the column direction. The word line conductive layers 31a-31d are constituted by polysilicon (poly-Si).

The memory transistor layer 30 includes a memory hole 32, as shown in FIG. 4. The memory hole 32 is formed so as to penetrate the word line conductive layers 31a-31d and the interlayer insulating layers not shown. The memory hole 32 is formed so as to align with an end vicinity in the column direction of the back gate hole 22.

In addition, the back gate transistor layer 20 and the memory transistor layer 30 include a memory gate insulating layer 33 and a memory semiconductor layer 34, as shown in FIG. 5. The memory semiconductor layer functions as bodies of the memory transistors MTr1-MTr8 (memory string MS).

The memory gate insulating layer 33 is formed with a certain thickness on a side surface of the back gate hole 22 and the memory hole 32, as shown in FIG. 5. The memory gate insulating layer 33 includes a block insulating layer 33a, a charge storage layer 33b, and a tunnel insulating layer 33c. Storing of a charge in the charge storage layer 33b causes the threshold voltage of the memory transistors MTr1-MTr8 to change, thereby allowing data retained in the memory transistors MTr to be overwritten.

The block insulating layer 33a is formed with a certain thickness on the side surface of the back gate hole 22 and the memory hole 32, as shown in FIG. 5. The charge storage layer 33b is formed with a certain thickness on a side surface of the block insulating layer 33a. The tunnel insulating layer 33c is formed with a certain thickness on a side surface of the charge storage layer 33b. The block insulating layer 33a and the tunnel insulating layer 33c are constituted by silicon oxide ($SiO_2$). The charge storage layer 33b is constituted by silicon nitride (SiN).

The memory semiconductor layer 34 is formed in contact with a side surface of the tunnel insulating layer 33c. The memory semiconductor layer 34 is formed so as to fill the back gate hole 22 and the memory hole 32. The memory semiconductor layer 34 is formed in a U shape as viewed from the row direction. The memory semiconductor layer 34 includes a pair of columnar portions 34a extending in the perpendicular direction with respect to the substrate 10 and a joining portion 34b configured to join lower ends of the pair of columnar portions 34a. The memory semiconductor layer 34 is constituted by polysilicon (poly-Si).

Expressing the above-described configuration of the back gate transistor layer 20 in other words, the memory gate insulating layer 33 is formed surrounding the joining portion 34b. The back gate conductive layer is formed surrounding the joining portion 34b. Moreover, expressing the above-described configuration of the memory transistor layer 30 in other words, the memory gate insulating layer 33 is formed surrounding the columnar portion 34a. The word line conductive layers 31a-31d are formed surrounding the columnar portion 34a with the memory gate insulating layer 33 interposed therebetween.

The select transistor layer 40 includes a first source side conductive layer 41a and a first drain side conductive layer 41b, as shown in FIG. 4. The first source side conductive layer 41a functions as the first source side select gate line SGS1 and also functions as a gate of the first source side select transistor SSTr1. The first drain side conductive layer 41b functions as the first drain side select gate line SGD1 and also functions as a gate of the first drain side select transistor SDTr1.

The first source side conductive layer 41a is formed in a layer above one of the columnar portions 34a configuring the memory semiconductor layer 34, and the first drain side conductive layer 41b is of the same layer as the first source side conductive layer 41a and formed in a layer above the other of the columnar portions 34a configuring the memory semiconductor layer 34. The first source side conductive layer 41a and the first drain side conductive layer 41b are formed in stripes extending in the row direction with a certain pitch in the column direction. The first source side conductive layer 41a and the first drain side conductive layer 41b are constituted by polysilicon (poly-Si).

The select transistor layer 40 includes a first source side hole 42a and a first drain side hole 42b, as shown in FIG. 4. The first source side hole 42a is formed so as to penetrate the first source side conductive layer 41a. The first drain side hole 42b is formed so as to penetrate the first drain side conductive layer 41b. The first source side hole 42a and the first drain side hole 42b are each formed at a position aligning with the memory hole 32.

The select transistor layer 40 includes a first source side gate insulating layer 43a, a first source side columnar semiconductor layer 44a, a first drain side gate insulating layer 43b, and a first drain side columnar semiconductor layer 44b, as shown in FIG. 5. The first source side columnar semiconductor layer 44a functions as a body of the first source side select transistor SSTr1. The first drain side columnar semiconductor layer 44b functions as a body of the first drain side select transistor SDTr1.

The first source side gate insulating layer 43a is formed with a certain thickness on a side surface of the first source side hole 42a. The first source side gate insulating layer 43a includes a block insulating layer 43aa, a charge storage layer 43ab, and a tunnel insulating layer 43ac. The charge storage layer 43ab functions to store a charge.

The block insulating layer 43aa is formed with a certain thickness on the side surface of the first source side hole 42a, as shown in FIG. 5. The block insulating layer 43aa is formed continuously in an integrated manner with the block insulating layer 33a. The charge storage layer 43ab is formed with a certain thickness on a side surface of the block insulating layer 43aa. The charge storage layer 43ab is formed continuously in an integrated manner with the charge storage layer 33b. The tunnel insulating layer 43ac is formed with a certain thickness on a side surface of the charge storage layer 43ab. The tunnel insulating layer 43ac is formed continuously in an integrated manner with the tunnel insulating layer 33c. The block insulating layer 43aa and the tunnel insulating layer 43ac are constituted by silicon oxide ($SiO_2$). The charge storage layer 43ab is constituted by silicon nitride (SiN).

The first source side columnar semiconductor layer 44a is formed in a column shape extending in the perpendicular direction with respect to the substrate 10 and in contact with aside surface of the first source side gate insulating layer 43a and an upper surface of one of the pair of columnar portions 34a. The first source side columnar semiconductor layer 44a is formed so as to fill the first source side hole 42a. The first source side columnar semiconductor layer 44a is formed continuously in an integrated manner with the columnar portion 34a. The first source side columnar semiconductor layer 44a is constituted by polysilicon (poly-Si).

The first drain side gate insulating layer 43b is formed with a certain thickness on a side surface of the first drain side hole 42b. The first drain side gate insulating layer 43b includes a block insulating layer 43*ba*, a charge storage layer 43*bb*, and a tunnel insulating layer 43*bc*. The charge storage layer 43*bb* stores a charge and thereby changes the threshold voltage of the first drain side select transistor SDTr1.

The block insulating layer 43*ba* is formed with a certain thickness on the side surface of the first drain side hole 42*b*, as shown in FIG. 5. The block insulating layer 43*ba* is formed continuously in an integrated manner with the block insulating layer 33*a*. The charge storage layer 43*bb* is formed with a certain thickness on a side surface of the block insulating layer 43*ba*. The charge storage layer 43*bb* is formed continuously in an integrated manner with the charge storage layer 33*b*. The tunnel insulating layer 43*bc* is formed with a certain thickness on a side surface of the charge storage layer 43*bb*. The tunnel insulating layer 43*bc* is formed continuously in an integrated manner with the tunnel insulating layer 33*c*. The block insulating layer 43*ba* and the tunnel insulating layer 43*bc* are constituted by silicon oxide ($SiO_2$). The charge storage layer 43*bb* is constituted by silicon nitride (SiN).

The first drain side columnar semiconductor layer 44*b* is formed in a column shape extending in the perpendicular direction with respect to the substrate 10 and in contact with a side surface of the first drain side gate insulating layer 43*b* and an upper surface of the other of the pair of columnar portions 34*a*. The first drain side columnar semiconductor layer 44*b* is formed so as to fill the first drain side hole 42*b*. The first drain side columnar semiconductor layer 44*b* is formed continuously in an integrated manner with the columnar portion 34*a*. The first drain side columnar semiconductor layer 44*b* is constituted by polysilicon (poly-Si).

In addition, the select transistor layer 40 includes a second source side conductive layer 45*a* and a second drain side conductive layer 45*b*, as shown in FIG. 4. The second source side conductive layer 45*a* functions as the second source side select gate line SGS2 and also functions as a gate of the second source side select transistor SSTr2. The second drain side conductive layer 45*b* functions as the second drain side select gate line SGD2 and also functions as a gate of the second drain side select transistor SDTr2.

The second source side conductive layer 45*a* is formed in a layer above the first source side conductive layer 41*a*. The second drain side conductive layer 45*b* is of the same layer as the second source side conductive layer 45*a* and formed in a layer above the first drain side conductive layer 41*b*. The second source side conductive layer 45*a* and the second drain side conductive layer 45*b* are constituted by polysilicon (poly-Si).

The select transistor layer 40 includes a second source side hole 46*a* and a second drain side hole 46*b*, as shown in FIG. 4. The second source side hole 46*a* is formed so as to penetrate the second source side conductive layer 45*a*. The second source side hole 46*a* is formed at a position aligning with the first source side hole 42*a*. The second drain side hole 46*b* is formed so as to penetrate the second drain side conductive layer 45*b*. The second drain side hole 46*b* is formed at a position aligning with the first drain side hole 42*b*.

The select transistor layer 40 includes a second source side gate insulating layer 47*a*, a second source side columnar semiconductor layer 48*a*, a second drain side gate insulating layer 47*b*, and a second drain side columnar semiconductor layer 48*b*, as shown in FIG. 5. The second source side columnar semiconductor layer 48*a* functions as a body of the second source side select transistor SSTr2. The second drain side columnar semiconductor layer 48*b* functions as a body of the second drain side select transistor SDTr2.

The second source side gate insulating layer 47*a* is formed with a certain thickness on a side surface of the second source side hole 46*a*. The second source side gate insulating layer 47*a* includes a block insulating layer 47*aa*, a charge storage layer 47*ab*, and a tunnel insulating layer 47*ac*. The charge storage layer 47*ab* stores a charge and thereby changes the threshold voltage of the second source side select transistor SSTr2.

The block insulating layer 47*aa* is formed with a certain thickness on the side surface of the second source side hole 46*a*, as shown in FIG. 5. The block insulating layer 47*aa* is formed continuously in an integrated manner with the block insulating layer 43*aa*. The charge storage layer 47*ab* is formed with a certain thickness on a side surface of the block insulating layer 47*aa*. The charge storage layer 47*ab* is formed continuously in an integrated manner with the charge storage layer 43*ab*. The tunnel insulating layer 47*ac* is formed with a certain thickness on a side surface of the charge storage layer 47*ab*. The tunnel insulating layer 47*ac* is formed continuously in an integrated manner with the tunnel insulating layer 43*ac*. The block insulating layer 47*aa* and the tunnel insulating layer 47*ac* are constituted by silicon oxide ($SiO_2$). The charge storage layer 47*ab* is constituted by silicon nitride (SiN).

The second source side columnar semiconductor layer 48*a* is formed in a column shape extending in the perpendicular direction with respect to the substrate 10 and in contact with a side surface of the second source side gate insulating layer 47*a* and an upper surface of the first source side columnar semiconductor layer 44*a*. The second source side columnar semiconductor layer 48*a* is formed so as to fill the second source side hole 46*a*. The second source side columnar semiconductor layer 48*a* is formed continuously in an integrated manner with the first source side columnar semiconductor layer 44*a*. The second source side columnar semiconductor layer 48*a* is constituted by polysilicon (poly-Si).

The second drain side gate insulating layer 47*b* is formed with a certain thickness on a side surface of the second drain side hole 46*b*. The second drain side gate insulating layer 47*b* includes a block insulating layer 47*ba*, a charge storage layer 47*bb*, and a tunnel insulating layer 47*bc*. The charge storage layer 47*bb* stores a charge and thereby changes the threshold voltage of the second drain side select transistor SDTr2.

The block insulating layer 47*ba* is formed with a certain thickness on the side surface of the second drain side hole 46*b*, as shown in FIG. 5. The block insulating layer 47*ba* is formed continuously in an integrated manner with the block insulating layer 43*ba*. The charge storage layer 47*bb* is formed with a certain thickness on a side surface of the block insulating layer 47*ba*. The charge storage layer 47*bb* is formed continuously in an integrated manner with the charge storage layer 43*bb*. The tunnel insulating layer 47*bc* is formed with a certain thickness on a side surface of the charge storage layer 47*bb*. The tunnel insulating layer 47*bc* is formed continuously in an integrated manner with the tunnel insulating layer 43*bc*. The block insulating layer 47*ba* and the tunnel insulating layer 47*bc* are constituted by silicon oxide ($SiO_2$). The charge storage layer 47*bb* is constituted by silicon nitride (SiN).

The second drain side columnar semiconductor layer 48*b* is formed in a column shape extending in the perpendicular direction with respect to the substrate 10 and in contact with a side surface of the second drain side gate insulating layer 47*b* and an upper surface of the first drain side columnar semiconductor layer 44*b*. The second drain side columnar semiconductor layer 48*b* is formed so as to fill the second drain side hole 46*b*. The second drain side columnar semiconductor layer 48*b* is formed continuously in an integrated manner with the first drain side columnar semiconductor layer 44b. The second drain side columnar semiconductor layer 48b is constituted by polysilicon (poly-Si).

Expressing the above-described configuration of the select transistor layer 40 in other words, the first source side gate insulating layer 43a is formed surrounding the first source side columnar semiconductor layer 44a. The first source side conductive layer 41a is formed surrounding the first source side columnar semiconductor layer 44a with the first source side gate insulating layer 43a interposed therebetween. The first drain side gate insulating layer 43b is formed surrounding the first drain side columnar semiconductor layer 44b. The first drain side conductive layer 41b is formed surrounding the first drain side columnar semiconductor layer 44b with the first drain side gate insulating layer 43b interposed therebetween.

Further expressing the above-described configuration of the select transistor layer 40 in other words, the second source side gate insulating layer 47a is formed surrounding the second source side columnar semiconductor layer 48a. The second source side conductive layer 45a is formed surrounding the second source side columnar semiconductor layer 48a with the second source side gate insulating layer 47a interposed therebetween. The second drain side gate insulating layer 47b is formed surrounding the second drain side columnar semiconductor layer 48b. The second drain side conductive layer 45b is formed surrounding the second drain side columnar semiconductor layer 48b with the second drain side gate insulating layer 47b interposed therebetween.

As described above, the select transistors SDTr1, SDTr2, SSTr1, and SSTr2 include the charge storage layers 43ab, 43bb, 47ab, and 47bb similar to the memory transistors MTr, and are configured to allow the threshold voltage to be changed by changing the amount of charge stored in the respective charge storage layers. Fundamentally, select transistors have no need to include such charge storage layers. However, from the viewpoint of reducing manufacturing costs, the select transistors in the present embodiment also include charge storage layers. That is, when only the select transistors are formed with a gate insulating layer that does not include a charge storage layer, the number of processes increases, and there is an inevitable increase in manufacturing costs. Accordingly, in the present embodiment, although it is not shown in the diagrams, the conductive layers 31a-31d, the conductive layers 41a, 41b, 45a, and 45b, and the interlayer insulating layers not shown that are sandwiched between these layers 31a-31d, 41a, 41b, 45a, and 45b, are first stacked, and then a U-shaped hole is formed and a silicon oxide film, a silicon nitride film (charge storage layer), and a silicon oxide film are sequentially deposited on a wall surface of the U-shaped hole, thereby attaining the configuration shown in FIG. 5.

However, when the gate insulating layer of the select transistors includes a charge storage layer, there is a risk that, in write and read operations on the memory cells, holes and electrons end up being trapped in the charge storage layer of the select transistors, resulting in the threshold voltage of the select transistors varying unintentionally.

Consequently, in the present embodiment, the control circuit AR2 is configured such that a threshold voltage-adjusting operation (write operation) is executable on the select transistors.

The wiring layer 50 is formed in a layer above the select transistor layer 40, as shown in FIG. 4. The wiring layer 50 includes a source line layer 51 and a bit line layer 52. The source line layer 51 functions as the source line SL. The bit line layer 52 functions as the bit line BL.

The source line layer 51 is formed in a plate-like shape extending in the row direction. The source line layer 51 is formed in contact with upper surfaces of a pair of the second source side columnar semiconductor layers 48a adjacent in the column direction. The bit line layer 52 is formed in stripes extending in the column direction with a certain pitch in the row direction and in contact with an upper surface of the second drain side columnar semiconductor layer 48b. The source line layer 51 and the bit line layer 52 are constituted by a metal such as tungsten (W).

Figure 6:
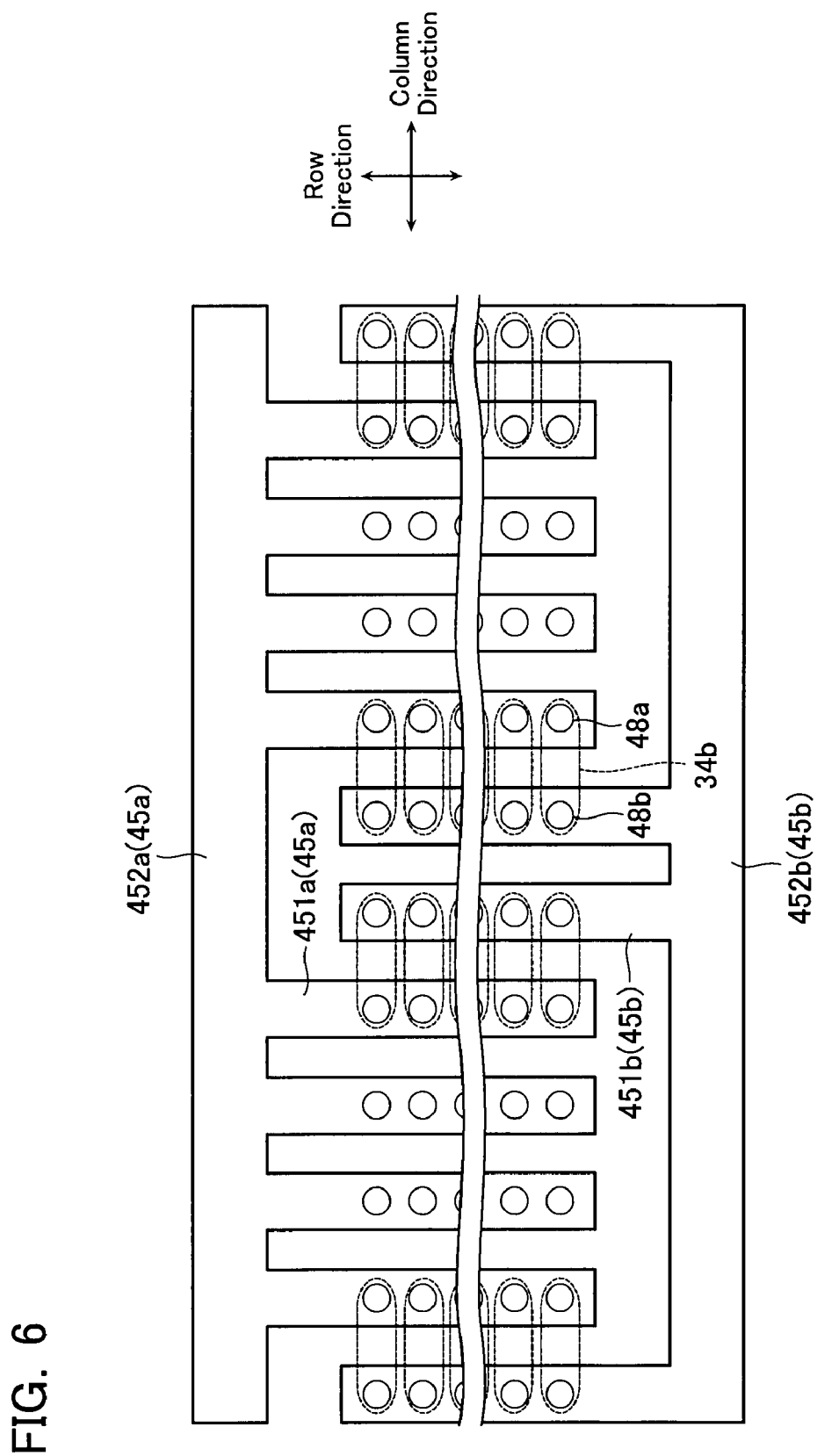
FIG. 6 is a top view showing a second source side conductive layer 45a and a second drain side conductive layer 45b.

Next, a shape of the second source side conductive layer 45a and the second drain side conductive layer 45b is described in detail with reference to FIG. 6. FIG. 6 is a top view showing the second source side conductive layer 45a and the second drain side conductive layer 45b.

As shown in FIG. 6, the second source side conductive layer 45a and the second drain side conductive layer 45b are each formed in a comb tooth shape as viewed from the perpendicular direction. The second source side conductive layer 45a comprises a plurality of straight portions 451a each configured to surround a plurality of the second source side columnar semiconductor layers 48a aligned in the row direction, and a straight portion 452a configured to join ends of the plurality of straight portions 451a. Similarly, the second drain side conductive layer 45b comprises a plurality of straight portions 451b each configured to surround a plurality of the second drain side columnar semiconductor layers 48b aligned in the row direction, and a straight portion 452b configured to join ends of the plurality of straight portions 451b. As shown in FIG. 6, four straight portions 451a and two straight portions 451b are provided alternately in the column direction.

Figure 7:
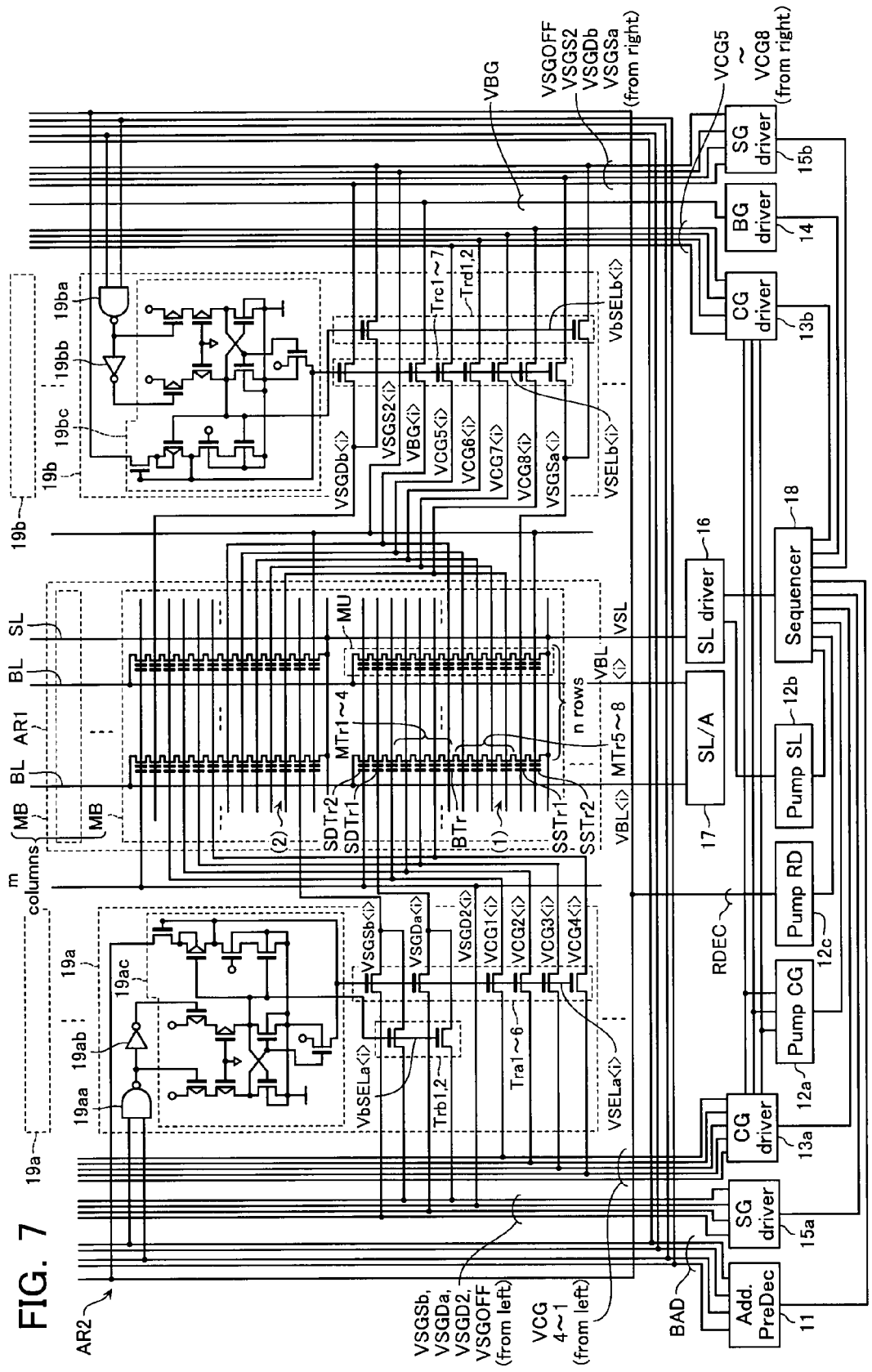
FIG. 7 is a circuit diagram showing a specific configuration of a control circuit AR2.

Next, a specific configuration of the control circuit AR2 is described with reference to FIG. 7. FIG. is a circuit diagram showing the specific configuration of the control circuit AR2. As shown in FIG. 7, the control circuit AR2 includes an address decoder circuit 11, boost circuits 12a-12c, word line drive circuits 13a and 13b, a back gate line drive circuit 14, select gate line drive circuits 15a and 15b, a source line drive circuit 16, a sense amplifier circuit 17, a sequencer 18, and row decoder circuits 19a and 19b.

As shown in FIG. 7, the address decoder circuit 11 outputs a signal BAD to the row decoder circuits 19a and 19b. The signal BAD is for specifying a memory block MB (block address).

The boost circuits 12a-12c generate a boost voltage that is a boosted reference voltage. As shown in FIG. 7, the boost circuit 12a transfers the boosted voltage to the word line drive circuits 13a and 13b. The boost circuit 12b transfers the boosted voltage to the source line drive circuit 16. The boost circuit 12c outputs a boosted signal RDEC to the row decoder circuits 19a and 19b.

As shown in FIG. 7, the word line drive circuit 13a outputs signals VCG1-VCG4. The word line drive circuit 13b outputs signals VCG5-VCG8. The signals VCG1-VCG8 are used when driving the word lines WL1-WL8 in a selected memory block MB<i>.

As shown in FIG. 7, the back gate line drive circuit 14 outputs a signal VBG. The signal VBG is used when driving the back gate line BG in the selected memory block MB<i>.

As shown in FIG. 7, the select gate line drive circuit 15a outputs a signal VSGSb, a signal VSGDa, a signal VSGD2, and a signal VSGOFF. The select gate line drive circuit 15b outputs a signal VSGSa, a signal VSGDb, a signal VSGS2, and the signal VSGOFF. The signal VSGSa and the signal VSGSb are used when driving the first-column and the second-column first source side select gate lines SGS1, respectively, in the selected memory block MB<i>. The signal VSGDa and the signal VSGDb are used when driving the first-column and the second-column first drain side select gate lines SGD1, respectively, in the selected memory block MB<i>. The signal VSGS2 is used when driving the second source side select gate line SGS2 in the selected memory block MB<i>. The signal VSGD2 is used when driving the second drain side select gate line SGD2 in the selected memory block MB<i>. The signal VSGOFF is used when driving the first source side select gate line SGS1 and the first drain side select gate line SGD1 in a non-selected memory block MB<i>.

Now, the above-mentioned signal VSGSb, signal VSGDa, and signal VSGOFF are inputted from the select gate line drive circuit 15a to various lines via the row decoder circuit 19a. In contrast, the signal VSGD2 is inputted as a signal VSGD2<i> directly from the select gate line drive circuit 15a to the gate of the second drain side select transistor SDTr2. Moreover, the signal VSGOFF, signal VSGDb, and signal VSGSa are inputted from the select gate line drive circuit 15b to various lines via the row decoder circuit 19b. In contrast, the signal VSGS2 is inputted as a signal VSGS2<i> directly from the select gate line drive circuit 15b to the gate of the second source side select transistor SSTr2. In addition, the signal VSGS2 and signal VSGD2 are supplied as a common signal over a plurality of memory blocks MB.

As shown in FIG. 7, the source line drive circuit 16 outputs a signal VSL. The signal VSL is used when driving the source line SL.

As shown in FIG. 7, the sense amplifier circuit 17 outputs a signal VBL<i>, thereby charging a certain bit line BL to a certain voltage, and then judges the retained data of the memory transistor MTr in the memory string MS on the basis of a change in voltage of the bit line BL. In addition, the sense amplifier circuit 17 outputs the signal VBL<i> appropriate to a write data to a certain bit line BL.

As shown in FIG. 7, the sequencer 18 supplies a control signal to the above-described circuits 11-17, thereby controlling the above-described circuits 11-17.

As shown in FIG. 7, the row decoder circuits 19a and 19b are provided one each to one of the memory blocks MB. The row decoder circuit 19a inputs signals VCG1<i>-VCG4<i> to gates of the memory transistors MTr1-MTr4, based on the signal BAD and the signals VCG1-VCG4. In addition, the row decoder circuit 19a selectively inputs a signal VSGSb<i> to a gate of the first source side select transistor SSTr1 in the second-column memory unit MU, based on the signal BAD, the signal VSGSb, and the signal VSGOFF. Furthermore, the row decoder circuit 19a selectively inputs a signal VSGDa<i> to a gate of the first drain side select transistor SDTr1 in the first-column memory unit MU, based on the signal BAD, the signal VSGDa, and the signal VSGOFF.

The row decoder circuit 19a includes a NAND circuit 19aa, a NOT circuit 19ab, a voltage conversion circuit 19ac, first transfer transistors Tra1-Tra6, and second transfer transistors Trb1 and Trb2. The voltage conversion circuit 19ac generates a signal VSELa<i> based on the signal BAD which is received via the NAND circuit 19aa and the NOT circuit 19ab and on the signal RDEC, and outputs this signal VSELa<i> to gates of the first transfer transistors Tra1-Tra6. In addition, the voltage conversion circuit 19ac generates a signal VbSELa<i> based on the signal BAD and on the signal RDEC, and outputs this signal VbSELa<i> to gates of the second transfer transistors Trb1 and Trb2.

The first transfer transistors Tra1-Tra4 are connected between the word line drive circuit 13a and the respective word lines WL1-WL4. The first transfer transistors Tra1-Tra4 output the signals VCG1<i>-VCG4<i> to the word lines WL1-WL4, based on the signals VCG1-VCG4 and VSELa<i>. The first transfer transistor Tra5 is connected between the select gate line drive circuit 15a and the first source side select gate line SGS1 in the second-column memory unit MU. The first transfer transistor Tra5 outputs the signal VSGSb<i> to the first source side select gate line SGS1 in the second-column memory unit MU, based on the signal VSGSb and the signal VSELa<i>. The first transfer transistor Tra6 is connected between the select gate line drive circuit 15a and the first drain side select gate line SGD1 in the first-column memory unit MU. The first transfer transistor Tra6 outputs the signal VSGDa<i> to the first drain side select gate line SGD1 in the first-column memory unit MU, based on the signal VSGDa and the signal VSELa<i>.

The second transfer transistor Trb1 is connected between the select gate line drive circuit 15a and the first source side select gate line SGS1 in the second-column memory unit MU. The second transfer transistor Trb1 outputs the signal VSGSb<i> to the first source side select gate line SGS1 in the second-column memory unit MU, based on the signal VSGOFF and the signal VbSELa<i>. The second transfer transistor Trb2 is connected between the select gate line drive circuit 15a and the first drain side select gate line SGD1 in the first-column memory unit MU. The second transfer transistor Trb2 outputs the signal VSGDa<i> to the first drain side select gate line SGD1 in the first-column memory unit MU, based on the signal VSGOFF and the signal VbSELa<i>.

The row decoder circuit 19b inputs signals VCG5<i>-VCG8<i> to gates of the memory transistors MTr5-MTr8, based on the signal BAD and the signals VCG5-VCG8. In addition, the row decoder circuit 19b selectively inputs a signal VSGSa<i> to a gate of the first source side select transistor SSTr1 in the first-column memory unit MU, based on the signal BAD, the signal VSGSa, and the signal VSGOFF. Furthermore, the row decoder circuit 19b selectively inputs a signal VSGDb<i> to a gate of the first drain side select transistor SDTr1 in the second-column memory unit MU, based on the signal BAD, the signal VSGDb, and the signal VSGOFF.

The row decoder circuit 19b includes a NAND circuit 19ba, a NOT circuit 19bb, a voltage conversion circuit 19bc, first transfer transistors Trc1-Trc7, and second transfer transistors Trd1 and Trd2. The voltage conversion circuit 19bc generates a signal VSELb<i> based on the signal BAD which is received via the NAND circuit 19ba and the NOT circuit 19bb and on the signal RDEC, and outputs this signal VSELb<i> to gates of the first transfer transistors Trc1-Trc7. In addition, the voltage conversion circuit 19bc generates a signal VbSELb<i> based on the signal BAD and on the signal RDEC, and outputs this signal VbSELb<i> to gates of the second transfer transistors Trd1 and Trd2.

The first transfer transistors Trc1-Trc4 are connected between the word line drive circuit 13b and the respective word lines WL5-WL8. The first transfer transistors Trc1-Trc4 output the signals VCG5<i>-VCG8<i> to the word lines WL5-WL8, based on the signals VCG5-VCG8 and VSELb<i>. The first transfer transistor Trc5 is connected between the back gate line drive circuit 14 and the back gate line BG. The first transfer transistor Trc5 outputs a signal VBG<i> to the back gate line BG, based on the signal VBG and the signal VSELb<i>. The first transfer transistor Trc6 is connected between the select gate line drive circuit 15b and the first source side select gate line SGS1 in the first-column memory unit MU. The first transfer transistor Trc6 outputs the signal VSGSa<i> to the first source side select gate line SGS1 in the first-column memory unit MU, based on the signal VSGSa and the signal VSELb<i>. The first transfer transistor Trc7 is connected between the select gate line drive circuit 15b and the first drain side select gate line SGD1 in the second-column memory unit MU. The first transfer transistor Trc7 outputs the signal VSGDb<i> to the first drain side select gate line SGD1 in the second-column memory unit MU, based on the signal VSGDb and the signal VSELb<i>.

The second transfer transistor Trd1 is connected between the select gate line drive circuit 15b and the first source side select gate line SGS1 in the first-column memory unit MU. The second transfer transistor Trd1 outputs the signal VSGSa<i> to the first source side select gate line SGS1 in the first-column memory unit MU, based on the signal VSGOFF and the signal VbSELb<i>. The second transfer transistor Trd2 is connected between the select gate line drive circuit 15b and the first drain side select gate line SGD1 in the second-column memory unit MU. The second transfer transistor Trd2 outputs the signal VSGDb<i> to the first drain side select gate line SGD1 in the second-column memory unit MU, based on the signal VSGOFF and the signal VbSELb<i>.

Next, a processing for increasing the threshold voltage of the first source side select transistor SSTr1 and the first drain side select transistor SDTr1 in the nonvolatile semiconductor memory device in accordance with the first embodiment is described with reference to the flowchart of FIG. 8.

Figure 8:
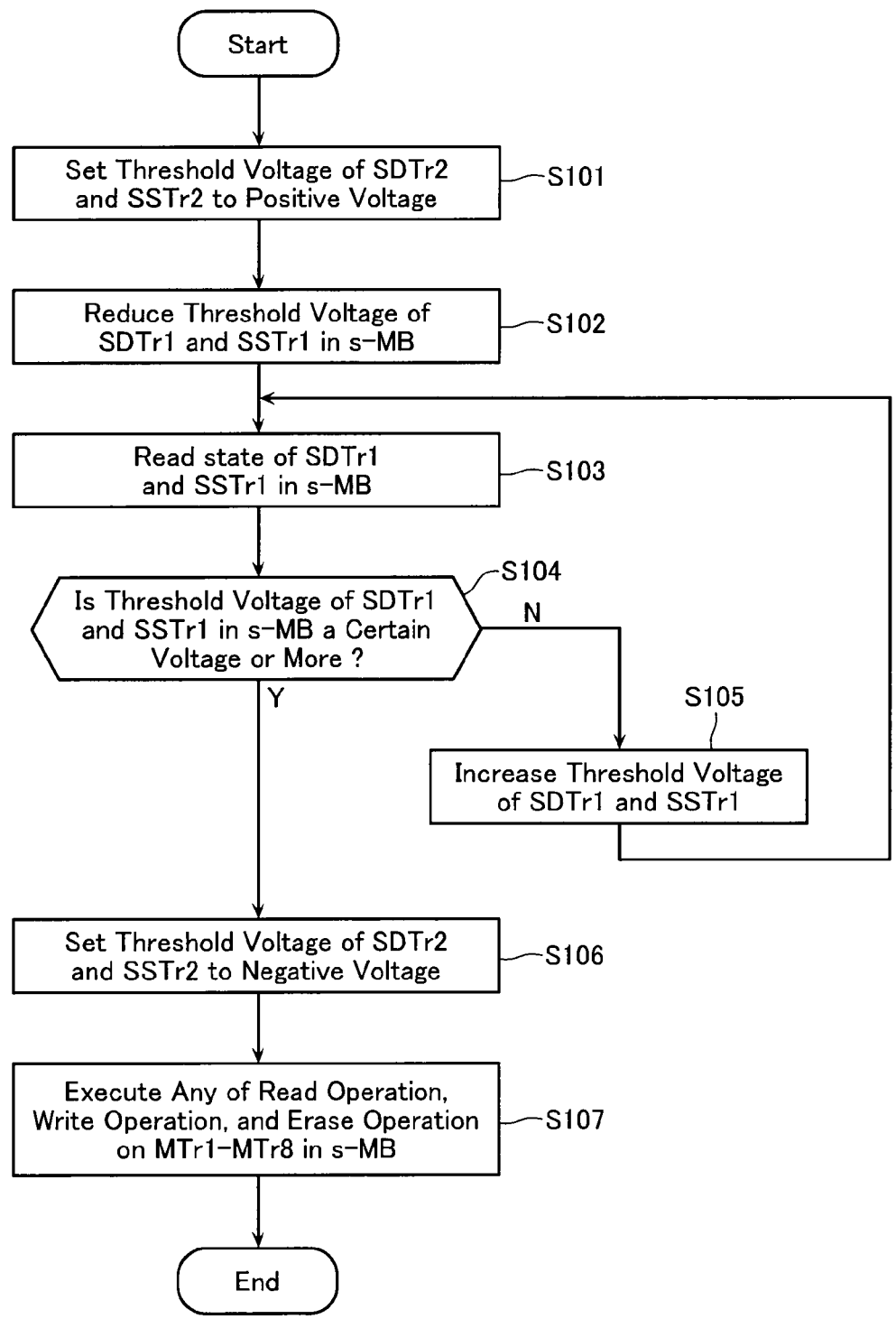
FIG. 8 is a flowchart showing a control operation of a threshold voltage in a first source side select transistor SSTr1 and a first drain side select transistor SDTr1.

As shown in FIG. 8, the control circuit AR2 changes the threshold voltage of all the second drain side select transistors SDTr2 and second source side select transistors SSTr2 in the memory cell array 11 from a negative voltage to a positive voltage (step S101). That is, in an ordinary state, the control circuit AR2 sets the the second drain side select transistor SDTr2 and second source side select transistor SSTr2 to depletion type (D type). However, when executing the processing for increasing the threshold voltage of the first source side select transistor SSTr1 and the first drain side select transistor SDTr1, the control circuit AR2 temporarily switches these transistors from D type to enhancement type (E type). After completion of the processing, the control circuit AR2 changes them back to D type.

Next, the control circuit AR2 reduces the threshold voltage of the first drain side select transistors SDTr1 and first source side select transistors SSTr1 in a selected memory block s-MB (step S102). That is, the control circuit AR2 executes an erase operation on the first drain side select transistors SDTr1 and first source side select transistors SSTr1 in the selected memory block s-MB. Variations exist in the threshold voltage of the first drain side select transistors SDTr1 and first source side select transistors SSTr1, and this processing is therefore executed to once align the threshold voltage of all the first drain side select transistors SDTr1 and first source side select transistors SSTr1 in a certain range.

Subsequently, the control circuit AR2 reads a state of the first drain side select transistors SDTr1 and first source side select transistors SSTr1 in the selected memory block s-MB (S103).

Next, the control circuit AR2 judges whether or not the threshold voltage of the first drain side select transistors SDTr1 and first source side select transistors SSTr1 in the selected memory block s-MB is of a certain value or more, based on the state read in step S103 (step S104).

Here, when the control circuit AR2 judges that the threshold voltage of the first drain side select transistors SDTr1 and first source side select transistors SSTr1 in the selected memory block s-MB is less than the certain value (step S104, N), the control circuit AR2 executes a processing of step S105.

In step S105, the control circuit AR2 executes a write operation on the first drain side select transistors SDTr1 and first source side select transistors SDTr1 in the selected memory blocks-MB that have a threshold voltage less than the certain value in order to increase the threshold voltage of these transistors. In addition, in step S105, the control circuit AR2 leaves unincreased the threshold voltage of the first drain side select transistors SDTr1 and first source side select transistors SSTr1 that are not subject to having their threshold voltage increased (floating write prohibit scheme). That is, these transistors are provided with a state where the write operation is prohibited. Then, subsequent to step S105, the control circuit AR2 repeatedly executes the processing of step S103.

On the other hand, in step S104, when the control circuit AR2 judges that the threshold voltage of all the first drain side select transistors SDTr1 and first source side select transistors SSTr1 in the selected memory block s-MB is of the certain value or more (step S104, Y), the control circuit AR2 executes a processing of step S106.

In step S106, the control circuit AR2 changes the threshold voltage of all the second drain side select transistors SDTr2 and second source side select transistors SSTr2 in the memory cell array 11 from the positive voltage back to the negative voltage. That is, the control circuit AR2 changes the second drain side select transistors SDTr2 and second source side select transistors SSTr2 from E type back to D type.

Then, the control circuit AR2 executes any of a read operation, a write operation (write prohibit operation), and an erase operation on the memory transistors MTr1-MTr8 (step S107). With that, the control circuit AR2 completes the processing for increasing the threshold voltage of the first source side select transistor SSTr1 and the first drain side select transistor SDTr1.

Figure 9:
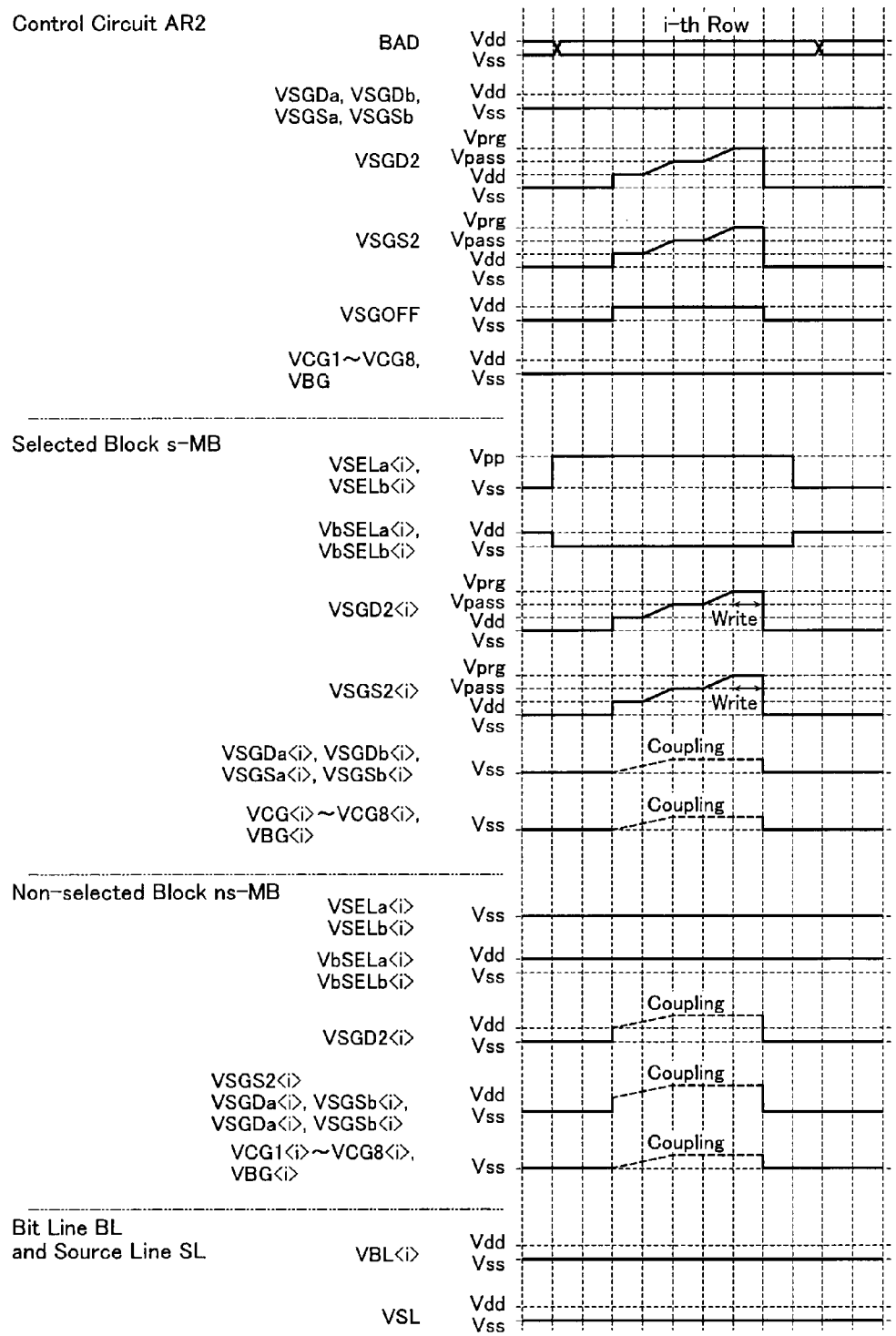
FIG. 9 is a timing chart showing various signals pertaining to processing of step S101.
Figure 10:
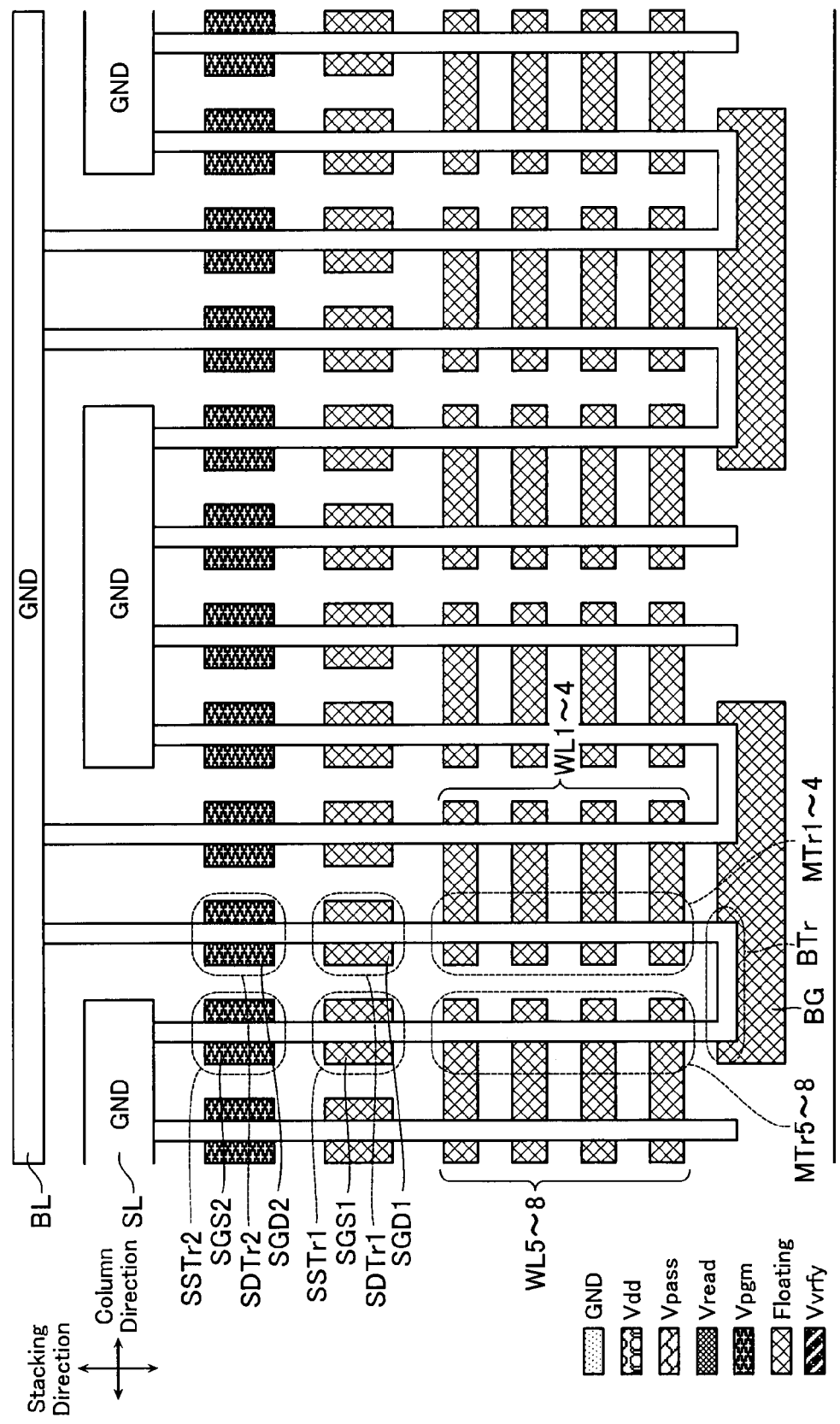
FIG. 10 is a view showing voltages applied to various lines in step S101.

Next, the processing of step S101 is described specifically with reference to FIGS. 9 and 10. In step S101, the signals outputted from the control circuit AR2, the signals within the selected/non-selected memory blocks s-MB/ns-MB, and the signals of the bit line BL and source line SL change as shown in FIG. 9. As shown in FIG. 10, in step S101, the control circuit AR2 applies a ground voltage GND (Vss) to the bit line BL and source line SL. Further, the control circuit AR2 applies a program voltage Vpgm (for example, 18 V) to the second source side select gate line SGS2 and second drain side select gate line SGD2.

The potential difference between this program voltage Vpgm and the ground voltage GND causes a charge to be stored in the charge storage layer of the second source side select transistor SSTr2 and the charge storage layer of the second drain side select transistor SDTr2. That is, the threshold voltage of the second source side select transistor SSTr2 and second drain side select transistor SDTr2 is set to a positive voltage due to this stored charge.

Figure 11:
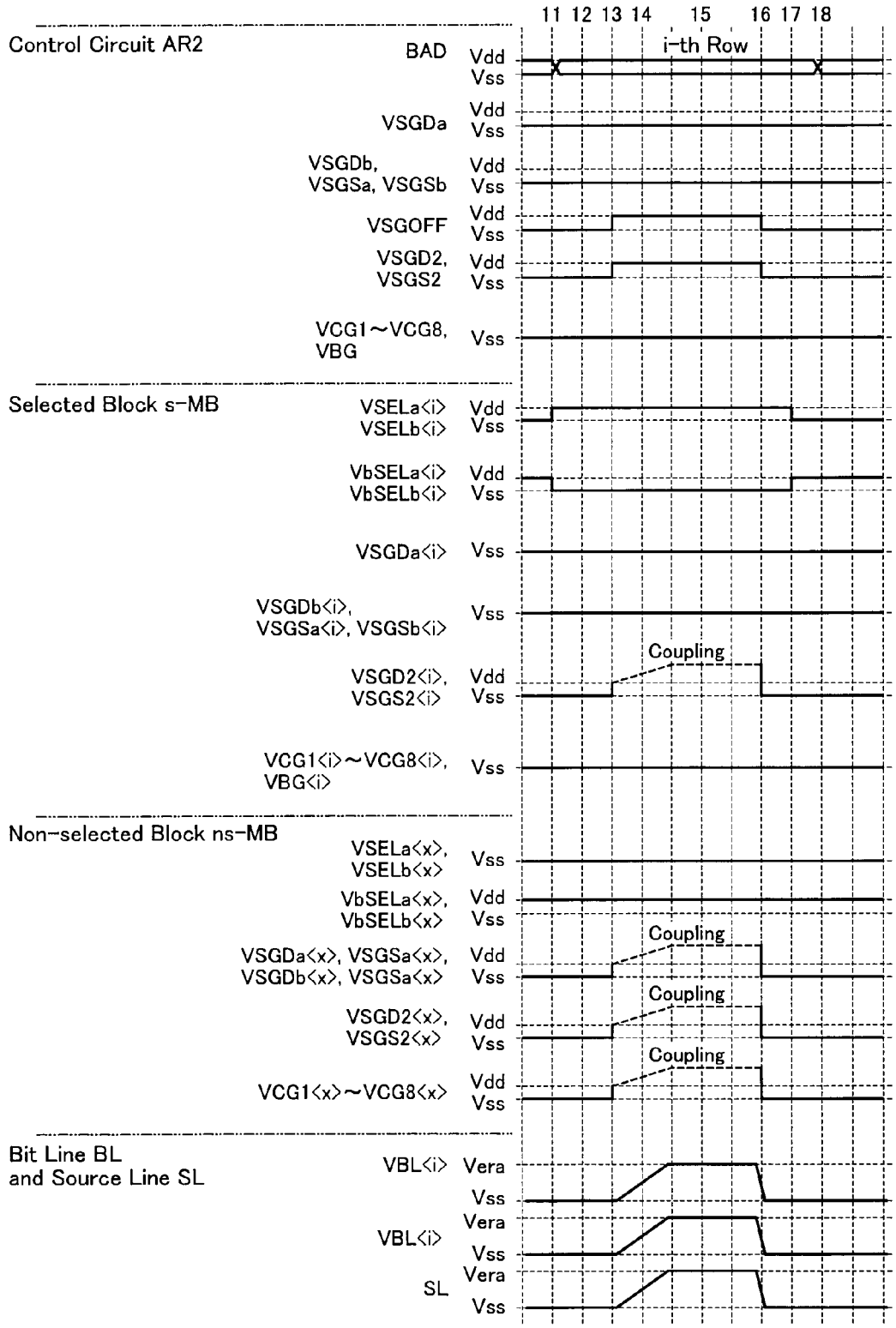
FIG. 11 is a timing chart showing various signals pertaining to processing of step S102.
Figure 12:
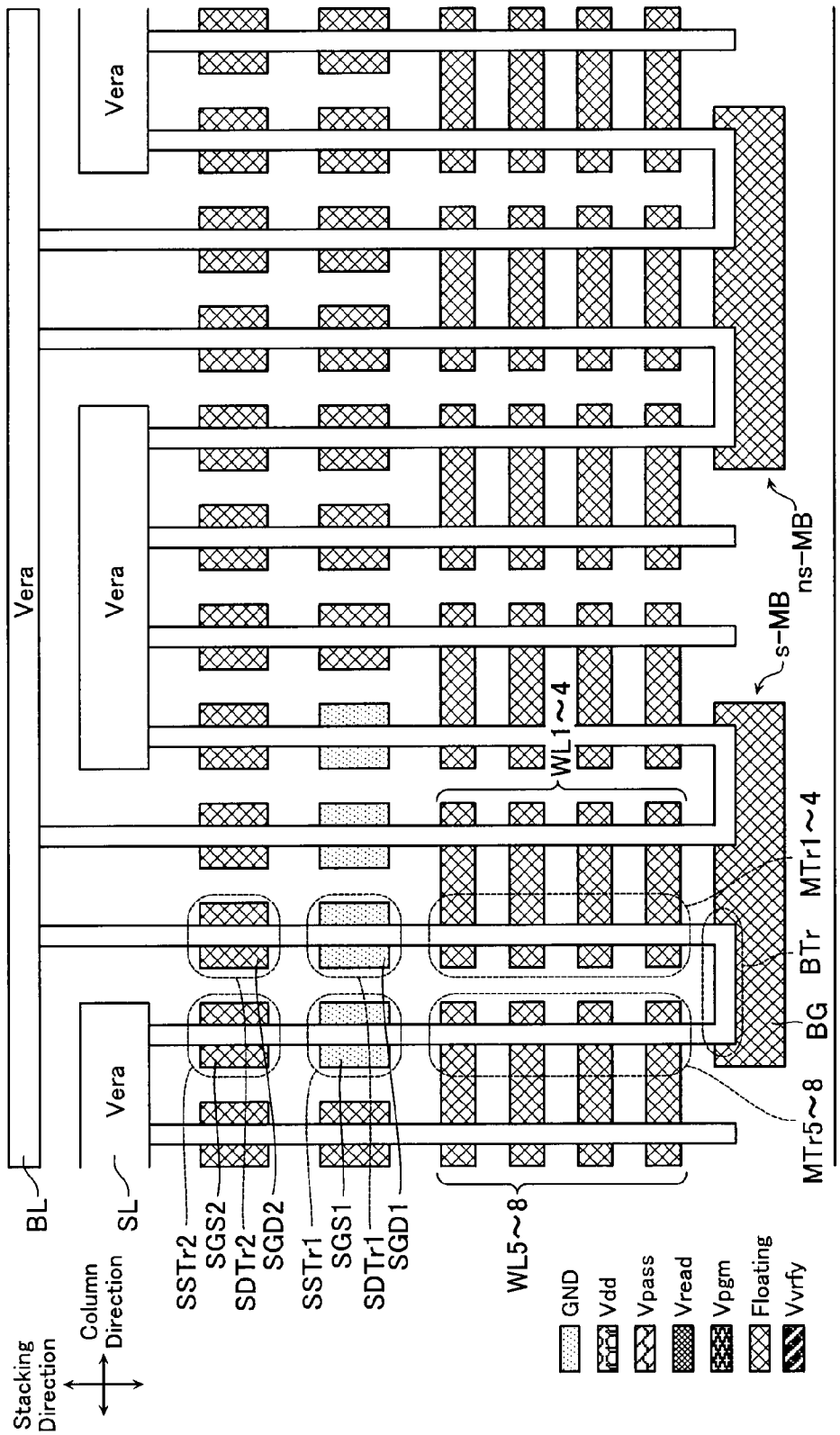
FIG. 12 is a view showing voltages applied to various lines in step S102.

Next, the processing of step S102 is described specifically with reference to FIGS. 11 and 12. In step S102, the signals outputted from the control circuit AR2, the signals within the selected/non-selected memory blocks s-MB/ns-MB, and the signals of the bit line BL and source line SL change as shown in FIG. 11. As shown in FIG. 12, in step S102, the control circuit AR2 applies an erase voltage Vera (for example, 20 V) to the bit line BL and source line SL. Further, the control circuit AR2 applies the ground voltage GND to the first drain side select gate line SGD1 and first source side select gate line SGS1 in the selected memory block s-MB.

This causes charge to be discharged from the charge storage layer of the first drain side select transistors SDTr1 and first source side select transistors SSTr1. That is, the threshold voltage of the first drain side select transistors SDTr1 and first source side select transistors SSTr1 in the selected memory block s-MB is reduced due to this discharged charge.

Figure 13:
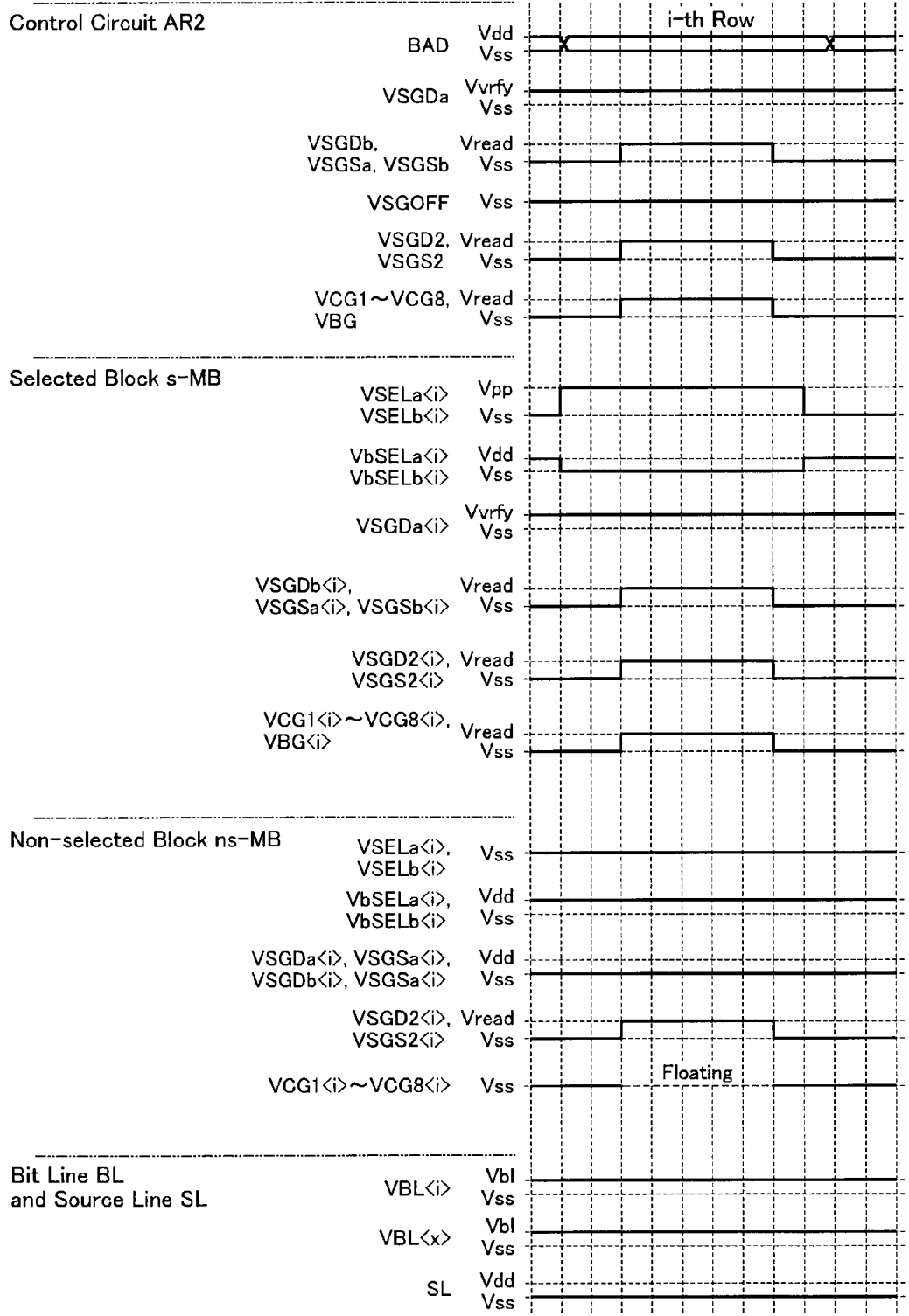
FIG. 13 is a timing chart showing various signals pertaining to processing of step S103.
Figure 14:
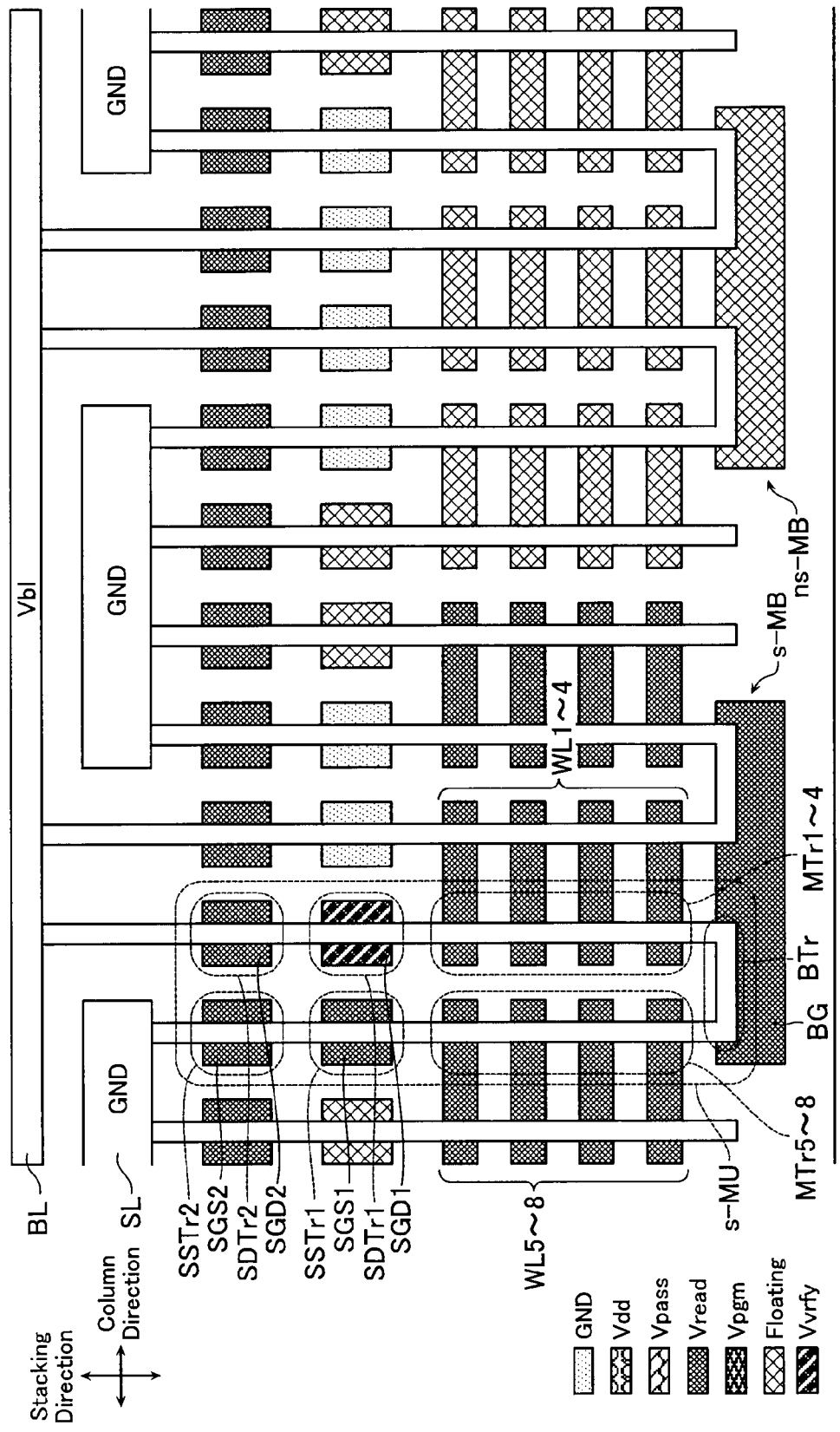
FIG. 14 is a view showing voltages applied to various lines in step S103.

Next, the processing for reading the state of the first drain side select transistors SDTr1 in step S103 is described specifically with reference to FIGS. 13 and 14. When reading the state of the first drain side select transistors SDTr1 in step S103, the signals outputted from the control circuit AR2, the signals within the selected/non-selected memory blocks s-MB/ns-MB, and the signals of the bit line BL and source line SL change as shown in FIG. 13. In this example, the case is described where the furthest leftward memory unit s-MU shown in FIG. 14 is selected, and the state of the first drain side select transistor SDTr1 selected from within that memory unit s-MU is read. As shown in FIG. 14, in step S103, the control circuit AR2 applies a voltage Vb1 (for example, 1.5 V) to the selected bit line BL, and applies the ground voltage GND to the source line SL. Further, the control circuit AR2 applies a read voltage Vread (for example, 6-8 V) to all the second drain side select gate lines SGD2 and second source side select gate lines SGS2, and also applies the read voltage Vread to the word lines WL1-WL8, the back gate line BG, and the first source side select gate line SGS1 connected to the memory unit s-MU. In addition, the control circuit AR2 applies a verify voltage Vvrfy (for example, 1 V) to the first drain side select gate line SGD1 in the memory unit s-MU. Note that the control circuit AR2 applies the ground voltage GND to non-selected ones of the first drain side select gate lines SGD1 and first source side select gate lines SGS1.

This results in the selected transistors SDTr2, SSTr1, SSTr2, MTr1-MTr8, and BTr being rendered in a conductive state. Detecting whether or not a current flows from the bit line BL to the source line SL via the selected first drain side select transistor SDTr1 in this state allows the state of the selected first drain side select transistor SDTr1 to be read.

Figure 15:
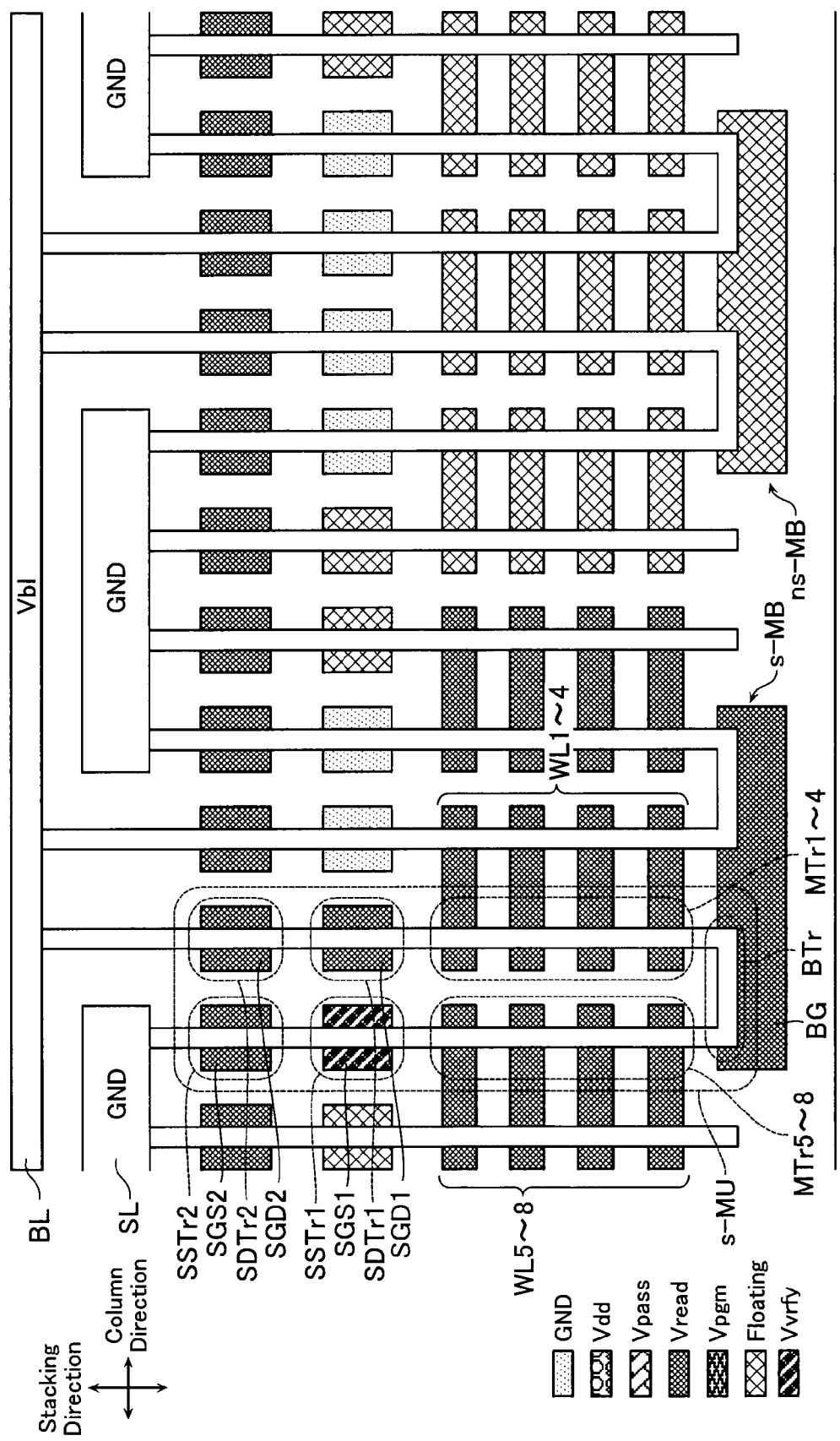
FIG. 15 is a view showing voltages applied to various lines in step S103.

Next, the processing for reading the state of the first source side select transistors SSTr1 in step S103 is described specifically with reference to FIG. 15. In this example, the case is described where the furthest leftward memory unit s-MU shown in FIG. 15 is selected, and the state of the first source side select transistor SSTr1 selected from within that memory unit s-MU is read. As shown in FIG. 15, in step S103, the control circuit AR2 applies the voltage Vb1 to the selected bit line BL, and applies the ground voltage GND to the source line SL. Further, the control circuit AR2 applies the read voltage Vread (for example, 6-8 V) to all the second drain side select gate lines SGD2 and second source side select gate lines SGS2, and also applies the read voltage Vread to the word lines WL1-WL8, the back gate line BG, and the first drain side select gate line SGD1 connected to the memory unit s-MU. In addition, the control circuit AR2 applies the verify voltage Vvrfy to the first source side select gate line SGS1 in the memory unit s-MU. Note that the control circuit AR2 applies the ground voltage GND to non-selected ones of the first drain side select gate lines SGD1 and first source side select gate lines SGS1.

This results in the selected transistors SDTr1, SDTr2, SSTr2, MTr1-MTr8, and BTr being rendered in a conductive state. Detecting whether or not a current flows from the bit line BL to the source line SL via the selected first source side select transistor SSTr1 in this state allows the state of the selected first source side select transistor SSTr1 to be read.

Figure 16:
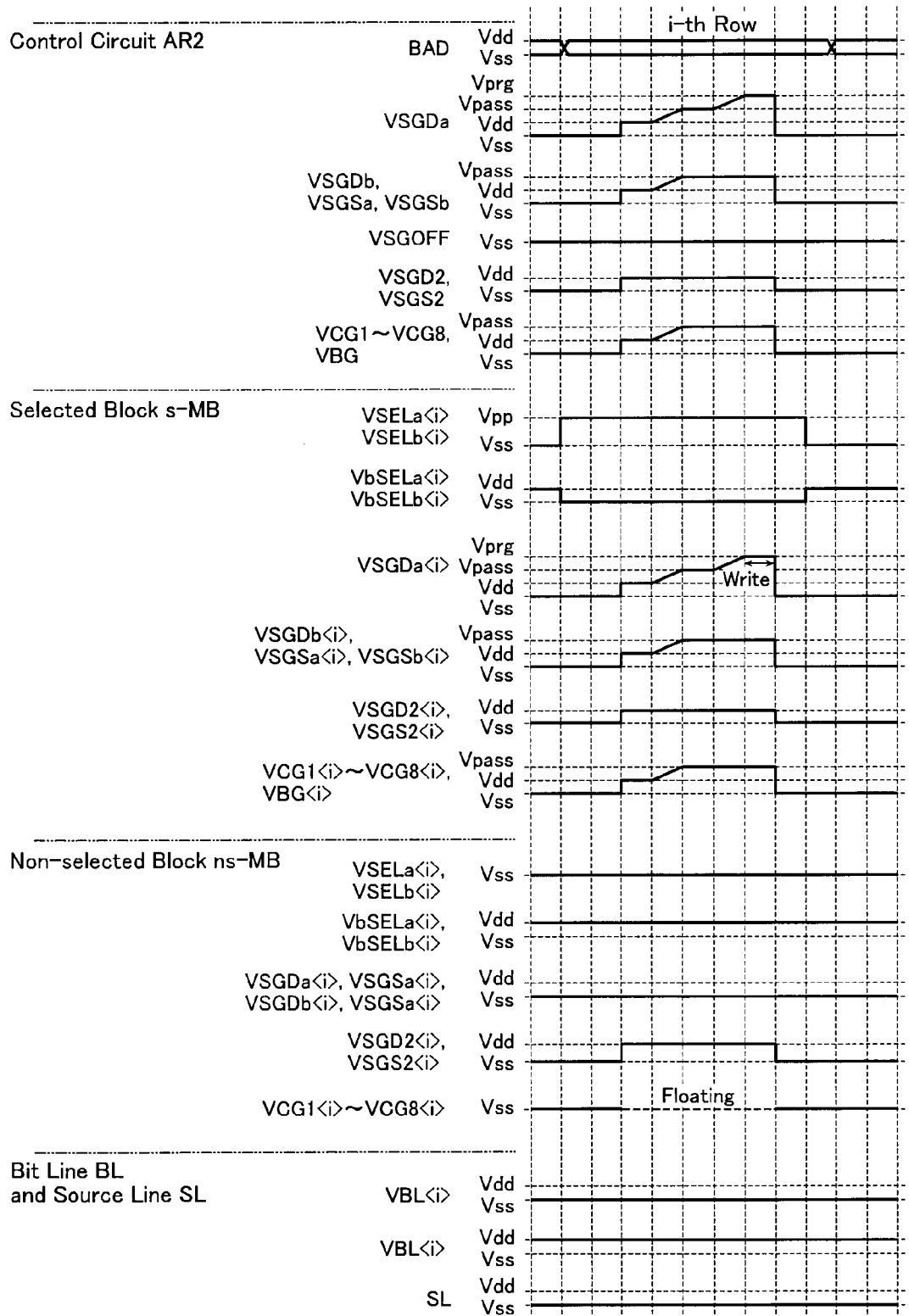
FIG. 16 is a timing chart showing various signals pertaining to processing of step S105.

Next, the processing for increasing the threshold voltage of the first drain side select transistor SDTr1 in step S105 is described specifically with reference to FIGS. 16-19. When increasing the threshold voltage of the first drain side select transistor SDTr1 in step S105, the signals outputted from the control circuit AR2, the signals within the selected/non-selected memory blocks s-MB/ns-MB, and the signals of the bit line BL and source line SL change as shown in FIG. 16.

Figure 17:
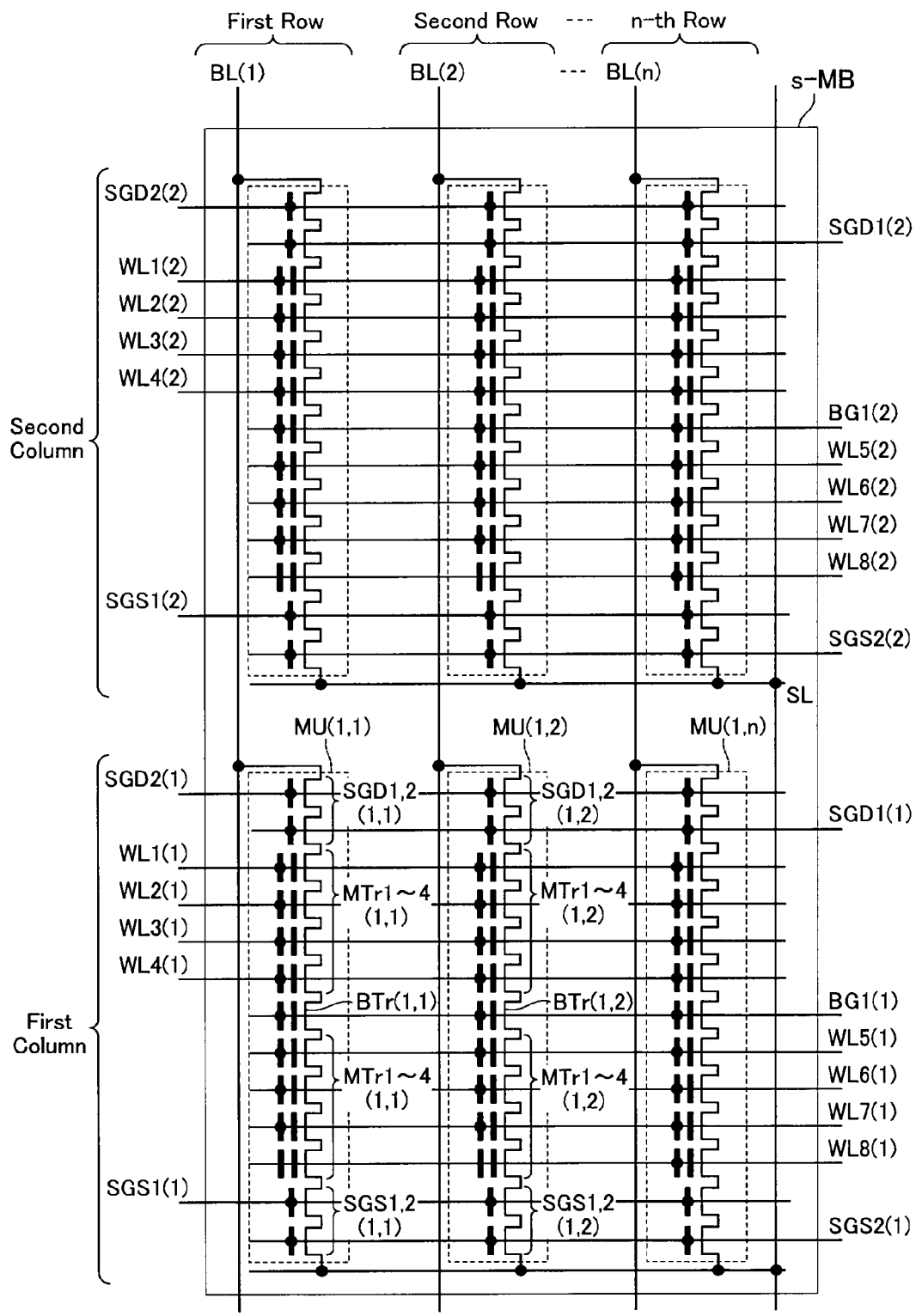
FIG. 17 is a schematic view showing processing of step S105.

In this example, as shown in FIG. 17, the case is described where the memory unit MU(1,1) positioned in the first column and first row within the selected memory block s-MB is selected, and the threshold voltage of the first drain side select transistor SDTr1(1,1) included in that memory unit MU(1,1) is increased. At this time, it is sometimes desired to leave the threshold voltage of first drain side select transistors SDTr1(1,2)-SDTr1(1,n) included in other memory units MU(1,2)-MU(1,n) existing in the same first column unincreased. Consequently, in the present embodiment, the following system is used to prohibit increase in the threshold voltage of these first drain side select transistors SDTr1(1,2)-SDTr1(1,n).

Figure 18:
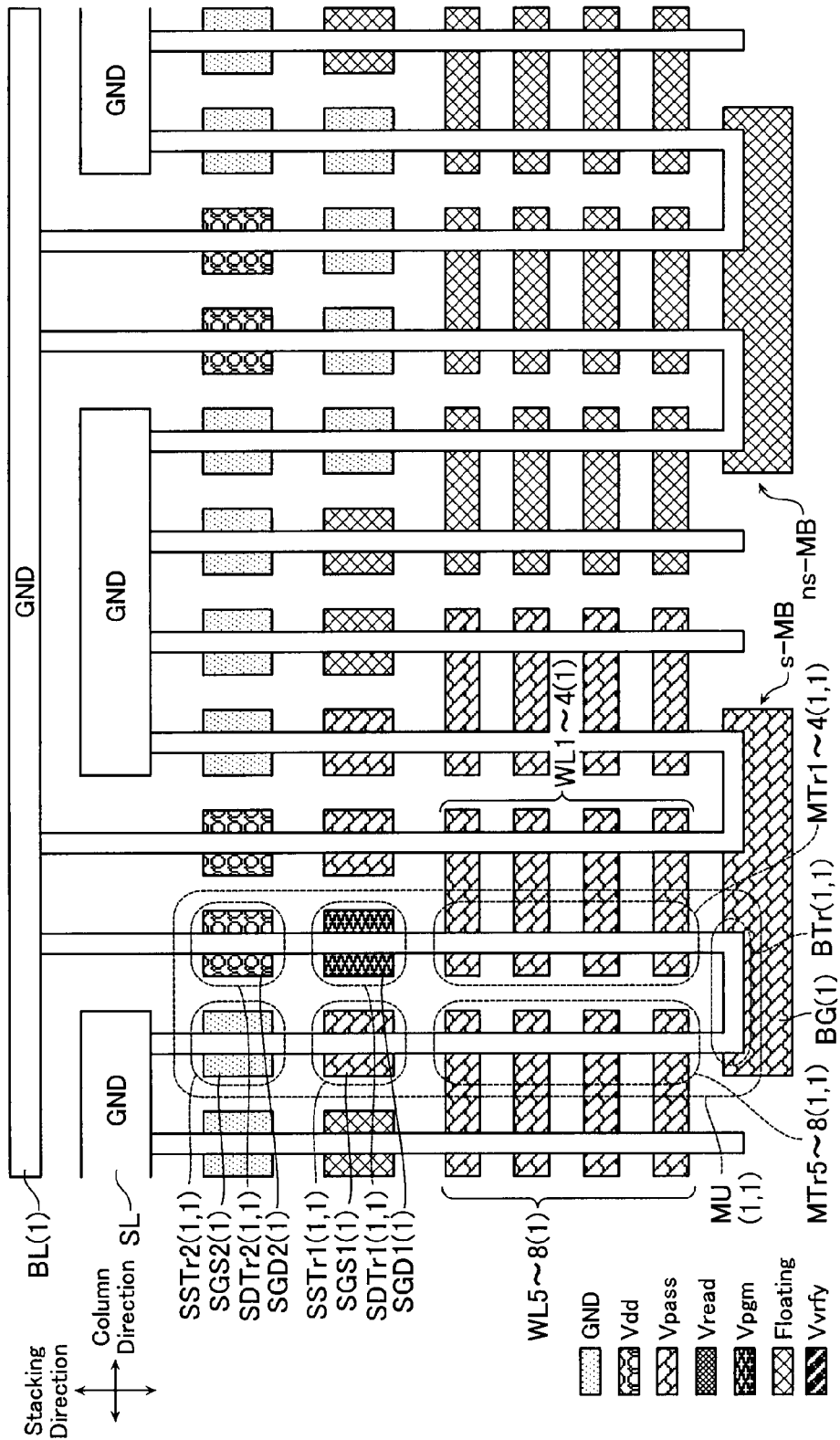
FIG. 18 is a view showing voltages applied to various lines when a threshold voltage of a first drain side select transistor SDTr1(1,1) in step S105 is increased.

FIG. 18 shows an outline of control for increasing the threshold voltage of the first drain side select transistor SDTr1(1,1). As shown in FIG. 18, the control circuit AR2 applies the ground voltage GND to the first-row bit line BL(1) and the source line SL. Further, the control circuit AR2 applies a power supply voltage Vdd (for example, 3 V) to the second drain side select gate line SGD2, and also applies the ground voltage GND to the second source side select gate line SGS2. This causes the second drain side select transistor SDTr2(1,1) to be rendered in a conductive state, and the ground voltage GND to be transferred from the bit line BL(1) to a body (first drain side columnar semiconductor layer) of the first drain side select transistor SDTr1(1,1). In addition, the second source side select transistor SSTr2(1,1) is rendered in a non-conductive state.

Next, the control circuit AR2 applies the program voltage Vpgm to the first-column first drain side select gate line SGD1(1) in the selected memory block s-MB, and applies a pass voltage Vpass (for example, 10 V) to the other first source side select gate lines SGS1 and first drain side select gate lines SGD1, the word lines WL1-WL8, and the back gate line BG in the selected memory block s-MB. As a result, the potential difference between the transferred ground voltage GND and the program voltage Vpgm applied to the first drain side select gate line SGD1(1) causes a charge to be stored in the charge storage layer of the first drain side select transistor SDTr1(1,1). That is, the threshold voltage of the first drain side select transistor SDTr(1,1) is increased due to this stored charge.

Figure 19:
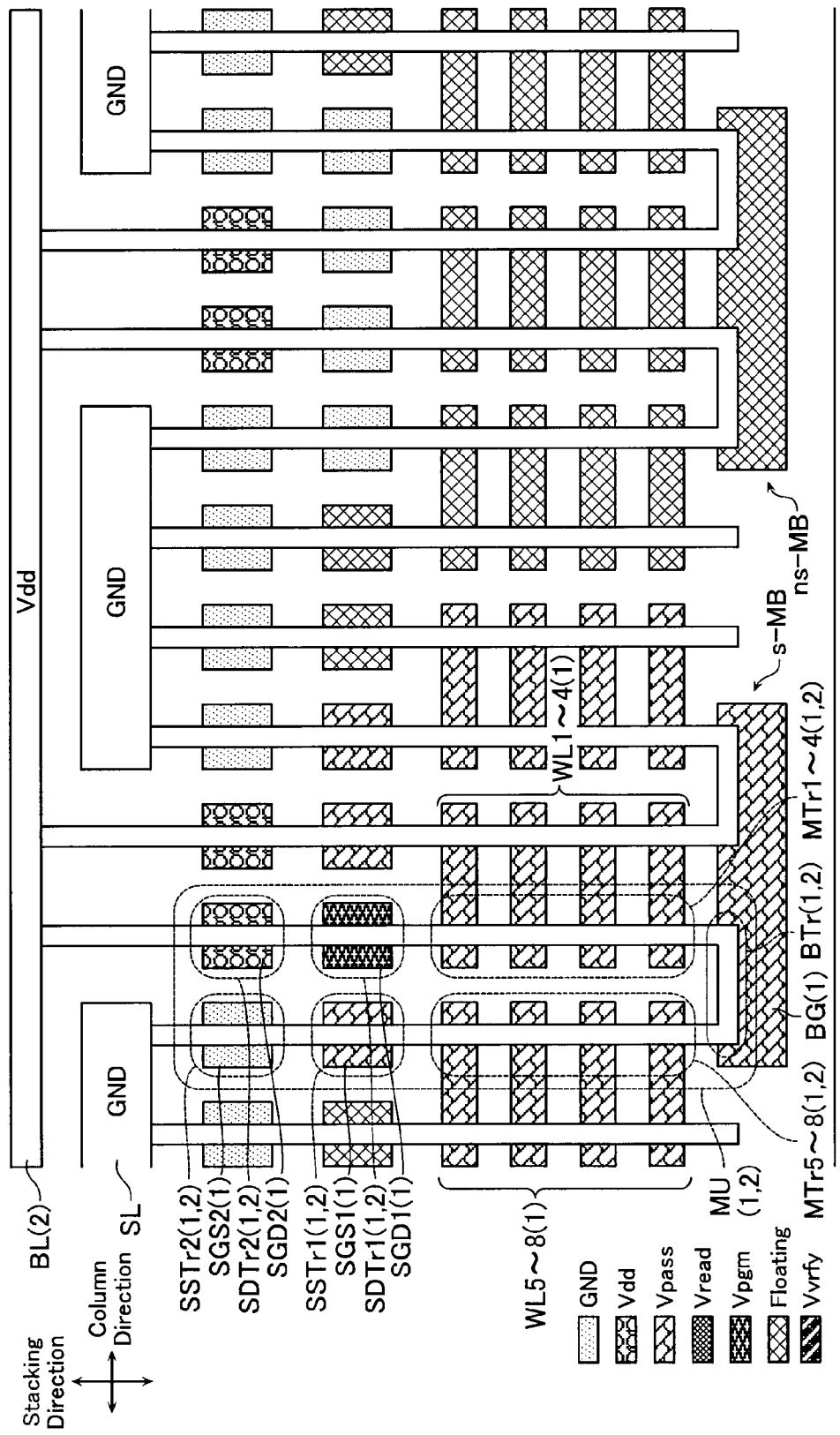
FIG. 19 is a view showing voltages applied to various lines when a threshold voltage of a first drain side select transistor SDTr1(1,2) in step S105 is left unincreased.

FIG. 19 shows an outline of control for leaving the threshold voltage of the first drain side select transistor SDTr1(1,2) unincreased. As shown in FIG. 19, the control circuit AR2 applies the power supply voltage Vdd to the second-row bit line BL(2), and applies the ground voltage GND to the source line SL. Further, the control circuit AR2 applies the power supply voltage Vdd to the second drain side gate lines SGD2 and applies the ground voltage GND to the second source side select gate lines SGS2. This causes the second drain side select transistor SDTr2(1,2) to be rendered in a conductive state, and the second source side select transistor SSTr2(1,2) to be rendered in a non-conductive state. Subsequently, a body (first drain side columnar semiconductor layer) of the first drain side select transistor SDTr1(1,2) and a body (memory columnar semiconductor layer) of the memory transistors MTr1(1,2)-MTr8(1,2) are charged from the bit line BL(2) via the second drain side select transistor SDTr2(1,2) to a voltage Vdd-Vth (Vth is the threshold voltage of the second drain side select transistor SDTr2(1,2)). Then, subsequent to the bodies being charged to the above-described voltage, the first drain side select transistor SDTr1(1,2) is cut off (rendered in a non-conductive state), and the body of the first drain side select transistor SDTr1(1,2) and body of the memory transistors MTr1(1,2)-MTr8(1,2) are rendered in a floating state.

Next, the control circuit AR2 applies similar voltages to the various lines as in FIG. 18. This causes the voltage of the body (first drain side columnar semiconductor layer) of the first drain side select transistor SDTr1(1,2) to increase due to coupling based on the voltages applied to the various lines. This means that even if the program voltage Vprg is applied to the gate of the first drain side select transistor SDTr1(1,2), a high voltage is not applied to its charge storage layer. That is, storage of charge in the charge storage layer is prohibited, and the threshold voltage of the first drain side select transistor SDTr1(1,2) is left unincreased.

Figure 20:
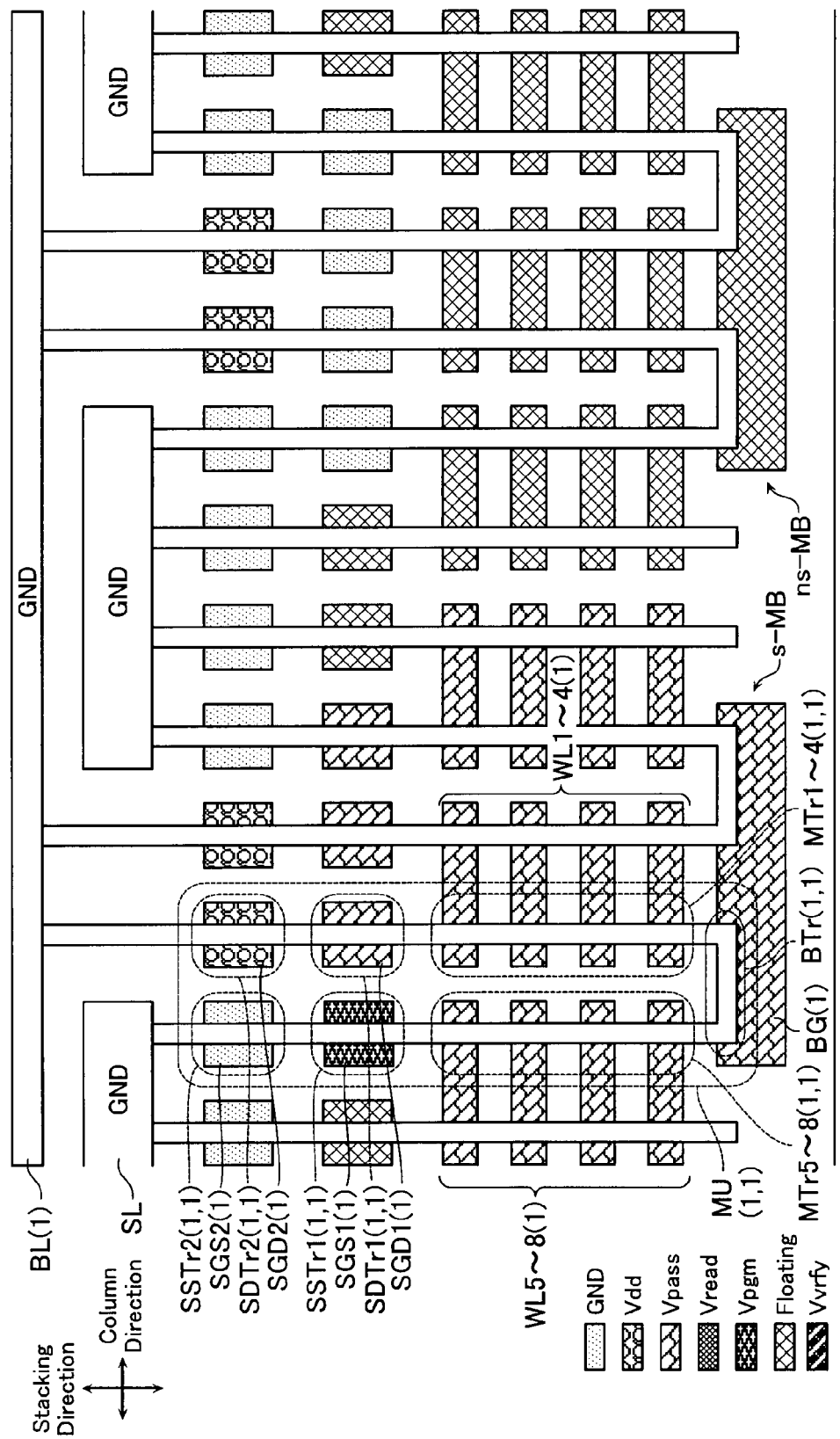
FIG. 20 is a view showing voltages applied to various lines when a threshold voltage of a first source side select transistor SSTr1(1,1) in step S105 is increased.
Figure 21:
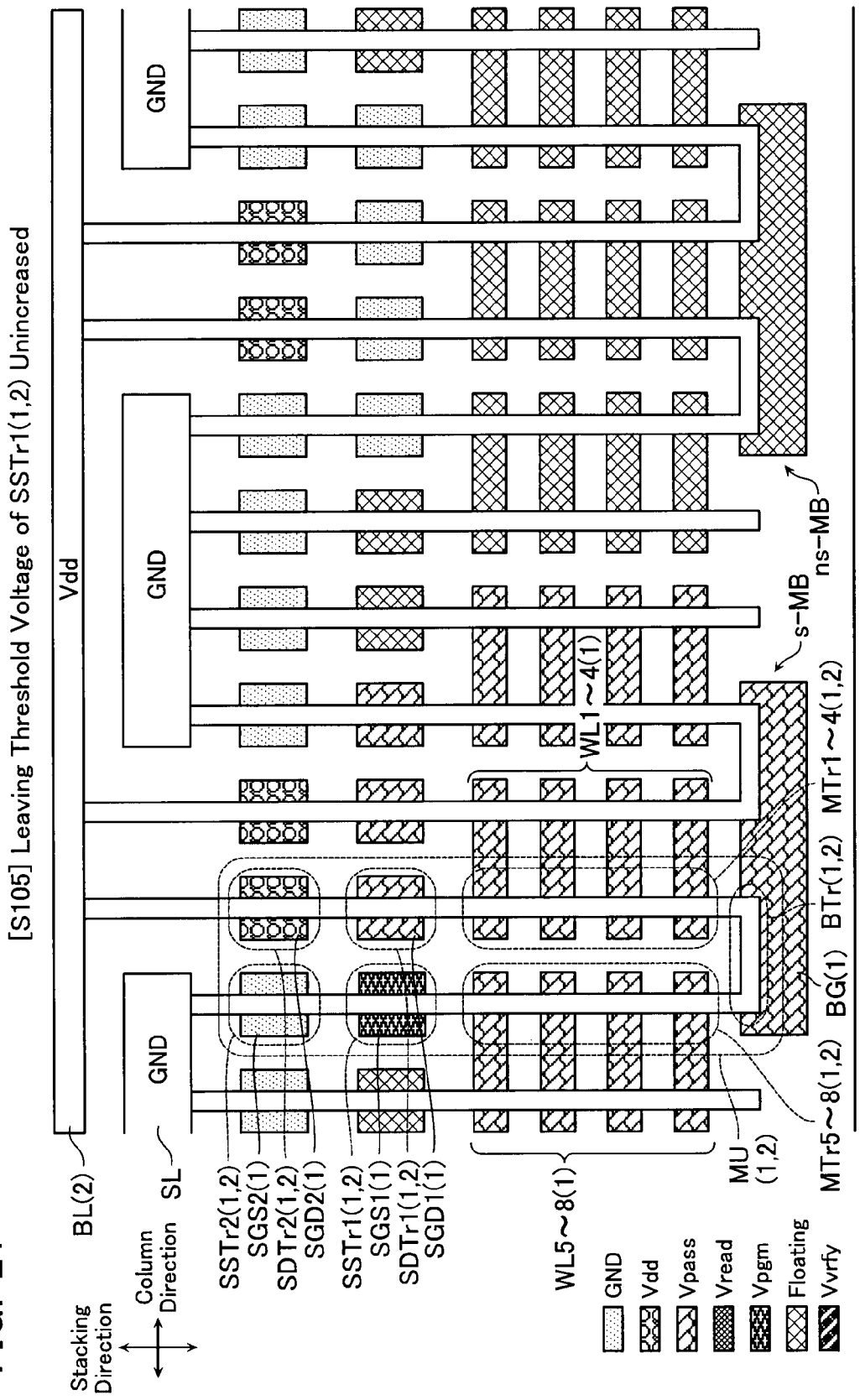
FIG. 21 is a view showing voltages applied to various lines when a threshold voltage of a first source side select transistor SSTr1(1,2) in step S105 is left unincreased.

Next, the processing for increasing the threshold voltage of the first source side select transistor SSTr1 in step S105 is described specifically with reference to FIGS. 17, 20, and 21.

In this example, as shown in FIG. 17, the case is described where the memory unit MU(1,1) positioned in the first column and first row within the selected memory block s-MB is selected, and the threshold voltage of the first source side select transistor SSTr1(1,1) included in that memory unit MU(1,1) is increased. At this time, it is sometimes desired to leave the threshold voltage of first source side select transistors SSTr1(1,2)-SSTr1(1,n) included in other memory units MU(1,2)-MU(1,n) existing in the same first column unincreased. Consequently, in the present embodiment, the following system is used to prohibit increase in the threshold voltage of these first source side select transistors SSTr1(1,2)-SSTr1(1,n).

FIG. 20 shows an outline of control for increasing the threshold voltage of the first source side select transistor SSTr1(1,1). As shown in FIG. 20, the control circuit AR2 applies the ground voltage GND to the first-row bit line BL(1) and the source line SL. Further, the control circuit AR2 applies the power supply voltage Vdd to the second drain side select gate line SGD2, and also applies the ground voltage GND to the second source side select gate line SGS2. This causes the second drain side select transistor SDTr2 to be rendered in a conductive state, and the second source side select transistor SSTr2 to be rendered in a non-conductive state.

Next, the control circuit AR2 applies the program voltage Vpgm to the first-column first source side select gate line SGS1(1) in the selected memory block s-MB, and applies the pass voltage Vpass to the other first source side select gate lines SGS1 and first drain side select gate lines SGD1, the word lines WL1-WL8, and the back gate line BG in the selected memory block s-MB. This causes the memory transistors MTr1(1,1)-MTr8(1,1) to be rendered in a conductive state, and the ground voltage GND to be transferred from the bit line BL(1) to a body (first source side columnar semiconductor layer) of the first source side select transistor SSTr1(1,1). Further, the potential difference between the transferred ground voltage GND and the program voltage Vpgm applied to the first source side select gate line SGS1(1) causes a charge to be stored in the charge storage layer of the first source side select transistor SSTr1(1,1). That is, the threshold voltage of the first source side select transistor SSTr(1,1) is increased due to this stored charge.

FIG. 21 shows an outline of control for leaving the threshold voltage of the first source side select transistor SSTr1(1,2) unincreased. As shown in FIG. 21, the control circuit AR2 applies the power supply voltage Vdd to the second-row bit line BL(2), and applies the ground voltage GND to the source line SL. Further, the control circuit AR2 applies the power supply voltage Vdd to the second drain side gate lines SGD2 and applies the ground voltage GND to the second source side select gate lines SGS2. This causes the second drain side select transistor SDTr2(1,2) to be rendered in a conductive state, and the second source side select transistor SSTr2(1,2) to be rendered in a non-conductive state. Subsequently, a body (first source side columnar semiconductor layer) of the first source side select transistor SSTr1(1,2) and a body (memory columnar semiconductor layer) of the memory transistors MTr1(1,2)-MTr8(1,2) are charged from the bit line BL(2) via the second drain side select transistor SDTr2(1,2) to the voltage Vdd-Vth. Then, subsequent to the bodies being charged to the above-described voltage, the first drain side select transistor SDTr1(1,2) is cut off (rendered in a non-conductive state), and the body of the first source side select transistor SSTr1(1,2) and body of the memory transistors MTr1(1,2)-MTr8(1,2) are rendered in a floating state.

Next, the control circuit AR2 applies similar voltages to the various lines as in FIG. 20. This causes the voltage of the body (first source side columnar semiconductor layer) of the first source side select transistor SSTr1(1,2) to increase due to coupling based on the voltages applied to the various lines. This means that even if the program voltage Vprg is applied to the gate of the first source side select transistor SSTr1(1,2), a high voltage is not applied to its charge storage layer. That is, storage of charge in the charge storage layer is prohibited, and the threshold voltage of the first source side select transistor SSTr1(1,2) is left unincreased.

Figure 22:
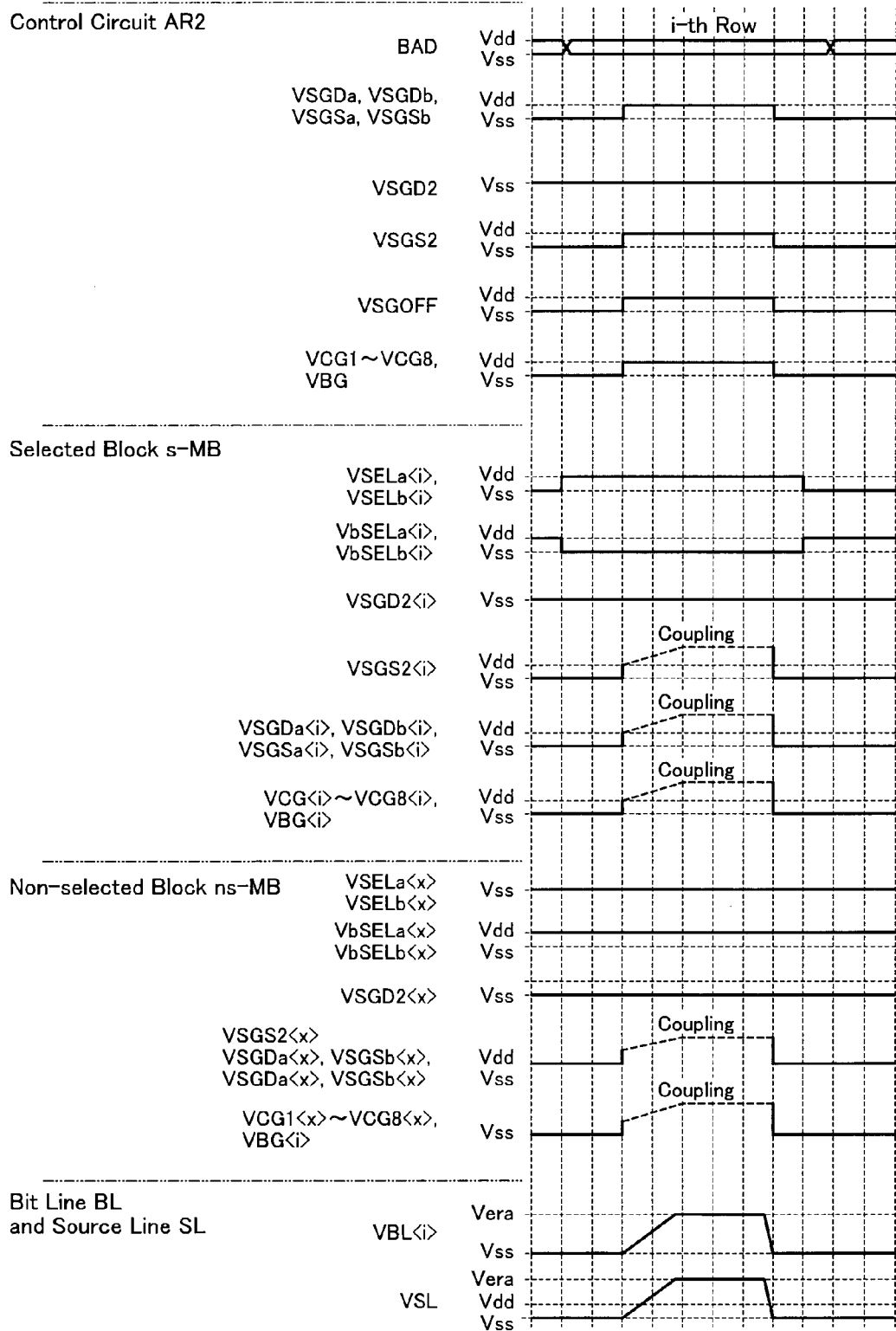
FIG. 22 is a timing chart showing various signals pertaining to processing of step S106.
Figure 23:
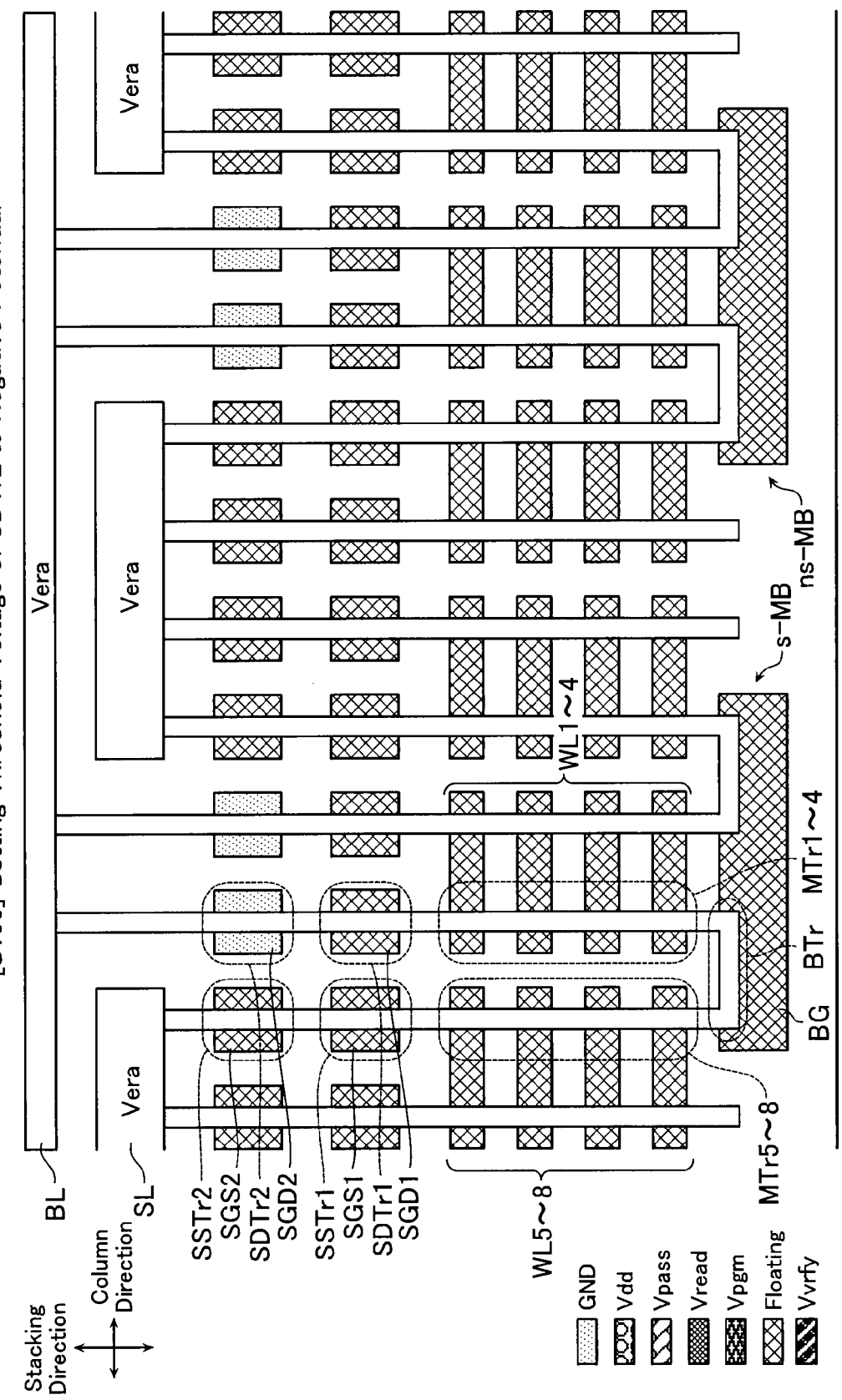
FIG. 23 is a view showing voltages applied to various lines when a threshold voltage of a second drain side select transistor SDTr2 in step S106 is set to a negative voltage.

Next, the processing for setting the threshold voltage of the second drain side select transistors SDTr2 to a negative voltage in step S106 is described specifically with reference to FIGS. 22 and 23. When setting the threshold voltage of the second drain side select transistors SDTr2 to a negative voltage in step S106, the signals outputted from the control circuit AR2, the signals within the selected/non-selected memory blocks s-MB/ns-MB, and the signals of the bit line BL and source line SL change as shown in FIG. 22. As shown in FIG. 23, the control circuit AR2 applies the erase voltage Vera to the bit line BL and source line SL, and applies the ground voltage GND to the second drain side select gate line SGD2. This causes charge to be discharged from the charge storage layer of the second drain side select transistors SDTr2, thereby setting the threshold voltage of the second drain side select transistors SDTr2 to a negative value.

Figure 24:
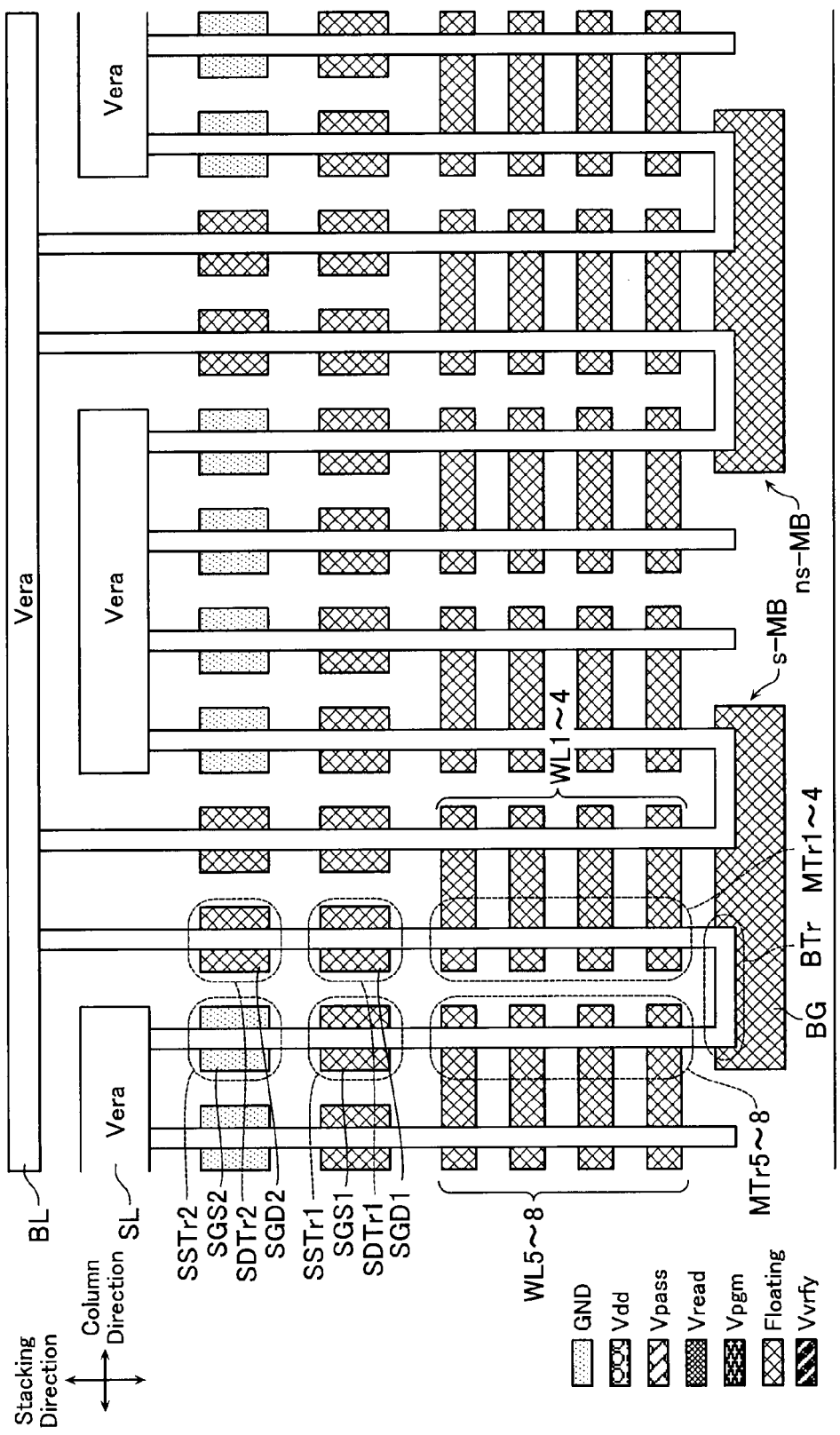
FIG. 24 is a view showing voltages applied to various lines when a threshold voltage of a second source side select transistor SSTr2 in step S106 is set to a negative voltage.
Figure 25:
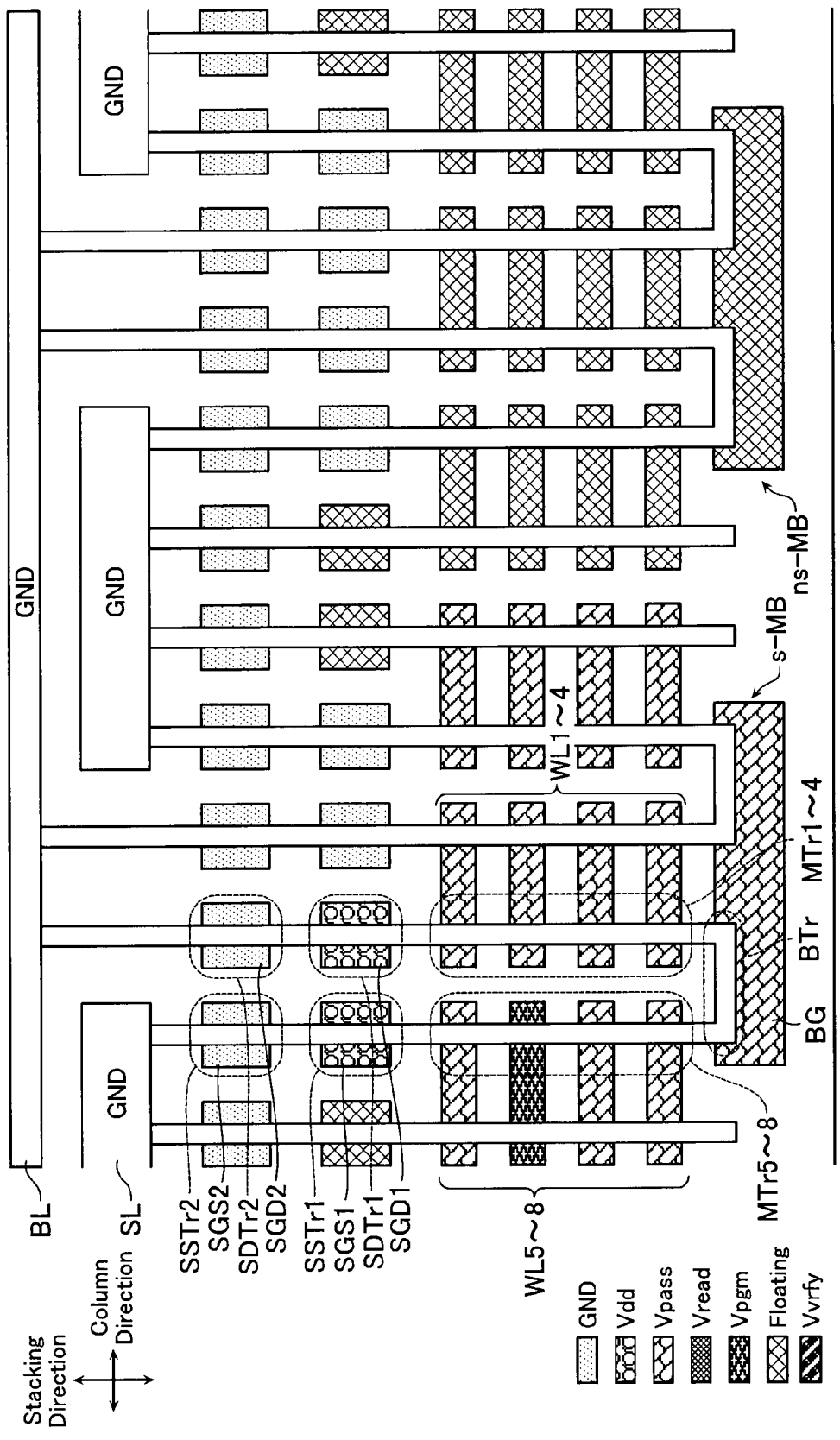
FIG. 25 is a view showing voltages applied to various lines during a write operation on a memory transistor MTr7 in step S107.
Figure 26:
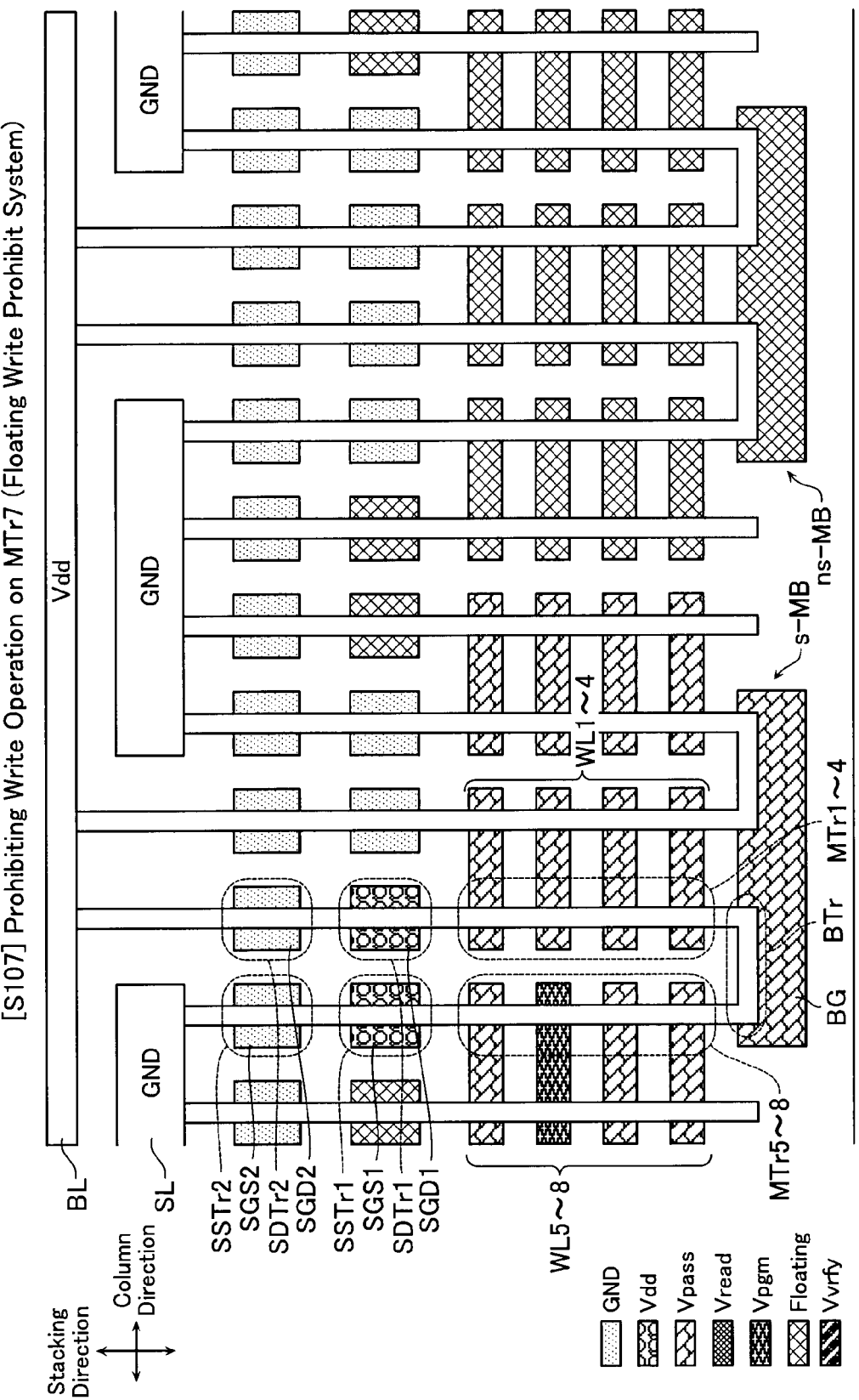
FIG. 26 is a view showing voltages applied to various lines during a write prohibit operation on the memory transistor MTr7 in step S107.
Figure 27:
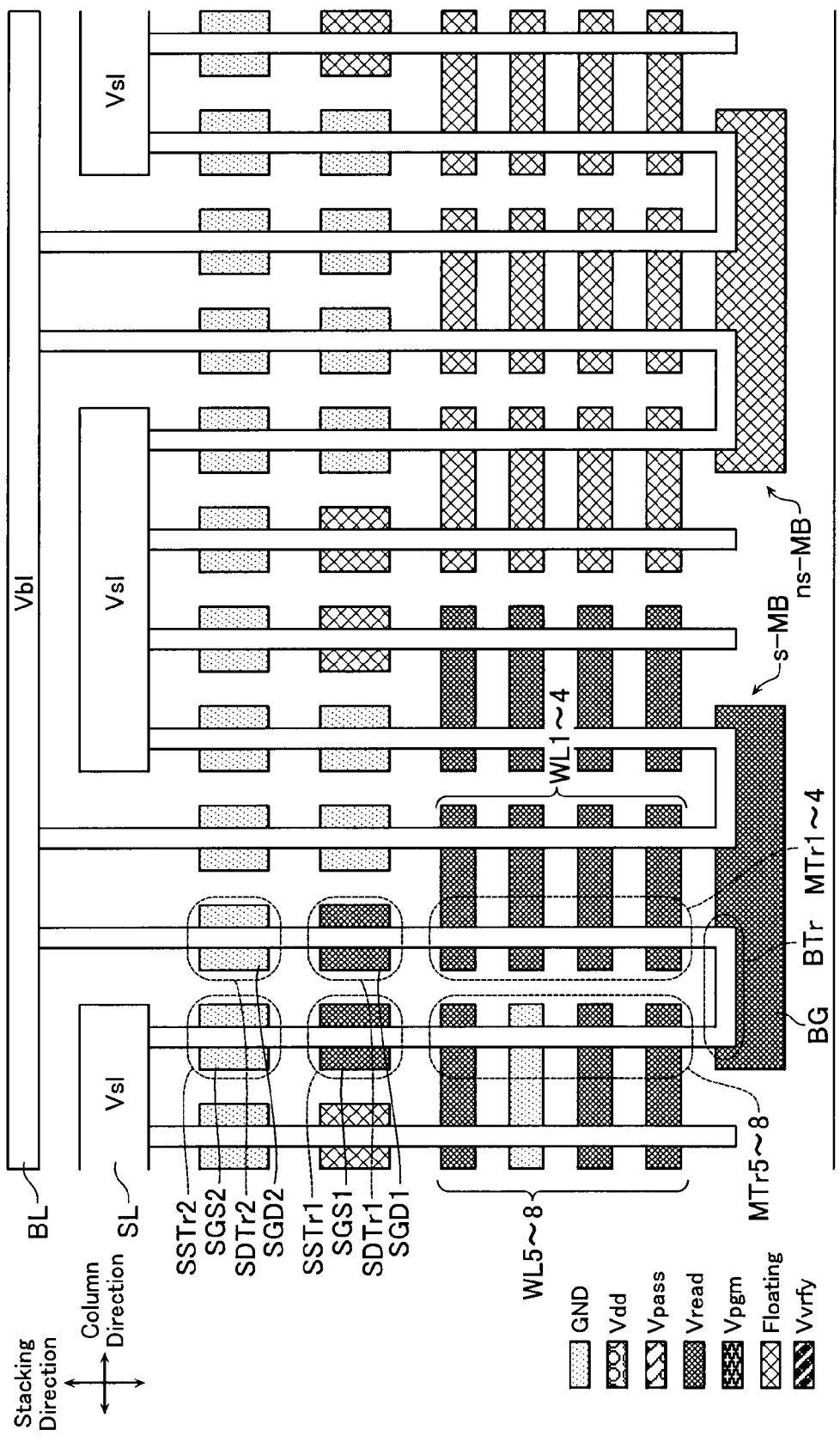
FIG. 27 is a view showing voltages applied to various lines during a read operation on the memory transistor MTr7 in step S107.
Figure 28:
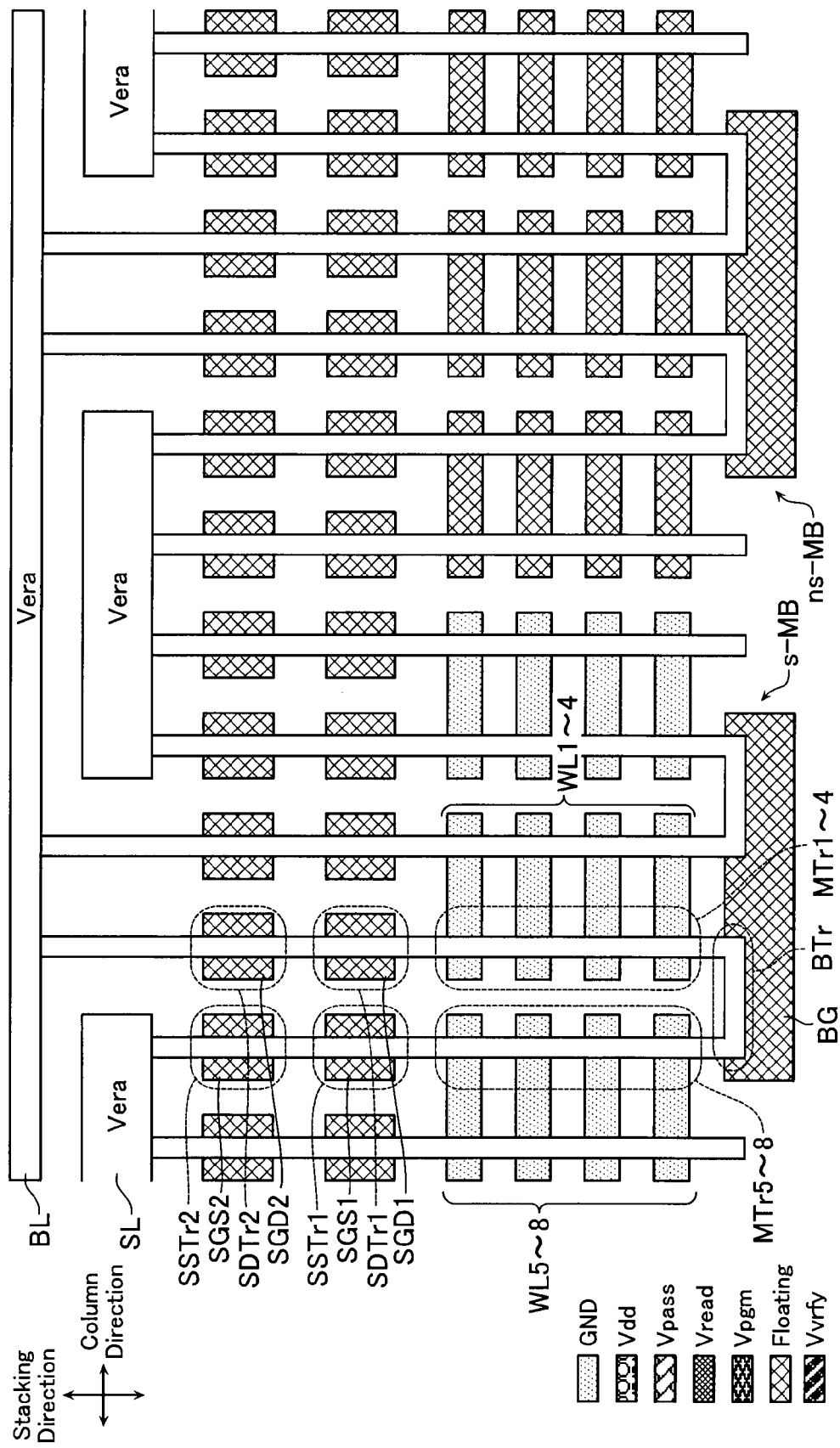
FIG. 28 is a view showing voltages applied to various lines during an erase operation on the memory transistor MTr7 in step S107.

Next, the processing for setting the threshold voltage of the second source side select transistors SSTr2 to a negative voltage in step S106 is described specifically with reference to FIG. 24. As shown in FIG. 24, the control circuit AR2 applies the erase voltage Vera to the bit line BL and source line SL, and applies the ground voltage GND to the second source side select gate line SGS2. This causes charge to be discharged from the charge storage layer of the second source side select transistors SSTr2, thereby setting the threshold voltage of the second source side select transistors SSTr2 to a negative value.

Next, the write operation, erase operation, and read operation on the memory transistors MTr1-MTr8 in step S107 are described specifically with reference to FIGS. 25-28. Voltages applied to the word lines WL, select gate lines SGD1 and SGS1, back gate line BG, and so on, are similar to those conventionally applied, and a detailed description thereof is thus omitted. However, as shown in FIGS. 25-28, during each of the operations, the control circuit AR2 applies the ground voltage GND to the second drain side select gate line SGD2 and second source side select gate line SGS2. The second drain side select transistors SDTr2 and second source side select transistors SSTr2 are ordinarily set to D type and thus maintain a conductive state even if the ground voltage GND is applied to their gates.

Next, advantages of the first embodiment are described. As described above, the first embodiment includes two drain side select transistors SDTr1 and SDTr2, and two source side select transistors SSTr1 and SSTr2. The transistors SDTr1 and SDTr2, and SSTr1 and SSTr2 each include a charge storage layer that changes the respective threshold voltages. The transistors SDTr1 and SDTr2, and SSTr1 and SSTr2 can thus be formed in one lot along with manufacture of the memory string MS (memory transistors MTr1-MTr8). That is, the first embodiment allows manufacturing costs to be curbed.

Furthermore, the first drain side select transistor SDTr1 and first source side select transistor SSTr1 are configured to have their threshold voltages increasable through a floating gate write prohibit system using, respectively, the second drain side select transistor SDTr2 and second source side select transistor SSTr2. That is, the first embodiment is able to have a first drain side select transistor SDTr1 and first source side select transistor SSTr1 with excellent cut-off characteristics, while curbing manufacturing costs. Moreover, there is no need in this embodiment to add a circuit for applying a negative voltage, and power consumption and occupied area can thus be curbed.

In addition, the second drain side select transistor SDTr2 and second source side select transistor SSTr2 are set to D type subsequent to adjustment of the threshold voltages of the first drain side select transistor SDTr1 and first source side select transistor SSTr1. As a result, there is no need in this embodiment to control the voltages applied to the gates of the transistors SDTr2 and SSTr2 when subsequently executing the likes of write, read, and erase operations on the memory transistors MTr1-MTr8. That is, this embodiment allows such control to be simplified.

[Second Embodiment]

Figure 29:
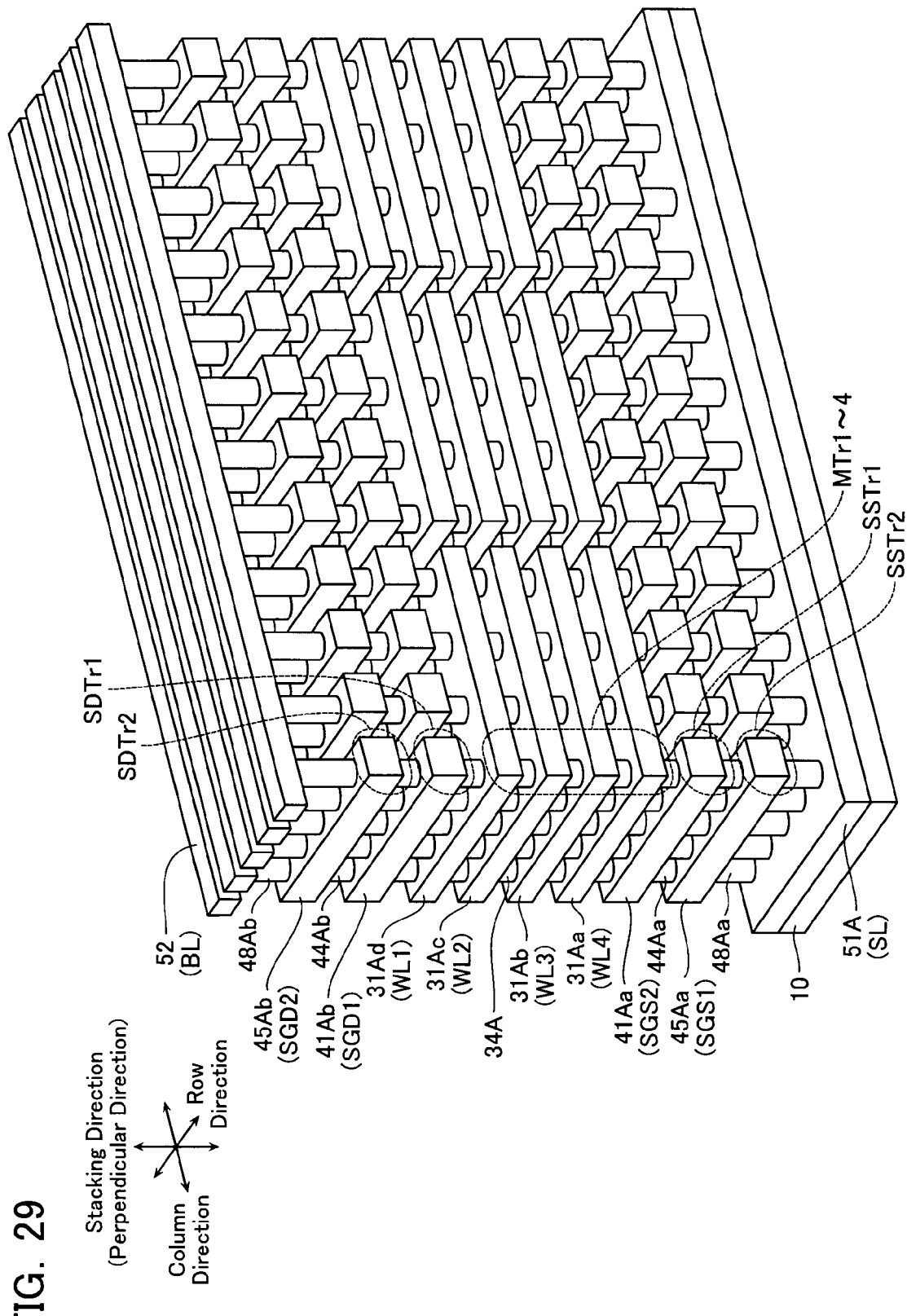
FIG. 29 is a perspective view showing a stacking structure of a nonvolatile semiconductor memory device in accordance with a second embodiment.

Next, a nonvolatile semiconductor memory device in accordance with a second embodiment is described with reference to FIG. 29. FIG. 29 is a perspective view showing a stacking structure of the nonvolatile semiconductor memory device in accordance with the second embodiment. Note that in the second embodiment, identical symbols are assigned to configurations similar to those in the first embodiment and descriptions thereof are omitted.

Now, in the first embodiment, the memory semiconductor layer 34 is formed in a U shape extending in the stacking direction as viewed from the row direction. In contrast, as shown in FIG. 29, a memory semiconductor layer 34A in accordance with the second embodiment is formed in an I shape (column shape) as viewed from the row direction and the column direction. Word line conductive layers 31Aa-31Ad are formed in a plate shape extending in the row direction and column direction on a memory block MB basis, and are formed surrounding a memory columnar semiconductor layer 34A with the memory gate insulating layer 33 interposed therebetween.

In addition, a first source side columnar semiconductor layer 44Aa is formed extending in the stacking direction from a lower surface of the memory columnar semiconductor layer 34A, and a second source side columnar semiconductor layer 48Aa is formed extending in the stacking direction from a lower surface of the first source side columnar semiconductor layer 44Aa. A first source side conductive layer 41Aa is formed surrounding the first source side columnar semiconductor layer 44Aa with the first source side gate insulating layer 43a interposed therebetween. A second source side conductive layer 45Aa is formed surrounding the second source side columnar semiconductor layer 48Aa with the second source side gate insulating layer 47a interposed therebetween.

Moreover, a first drain side columnar semiconductor layer 44Ab is formed extending in the stacking direction from an upper surface of the memory columnar semiconductor layer 34A, and a second drain side columnar semiconductor layer 48Ab is formed extending in the stacking direction from an upper surface of the first drain side columnar semiconductor layer 44Ab. A first drain side conductive layer 41Ab is formed surrounding the first drain side columnar semiconductor layer 44Ab with the first drain side gate insulating layer 43b interposed therebetween. A second drain side conductive layer 45Ab is formed surrounding the second drain side columnar semiconductor layer 48Ab with the second drain side gate insulating layer 47b interposed therebetween.

In addition, a diffusion layer 51A is formed at a position aligning with the second source side columnar semiconductor layer 48Aa, the diffusion layer 51A being an upper surface of the substrate 10. The diffusion layer 51A functions as the source line SL. The bit line layer 52 is formed in contact with an upper surface of the second drain side columnar semiconductor layer 48Ab.

The nonvolatile semiconductor memory device in accordance with the second embodiment executes similar operations to those of the flowchart shown in FIG. 8 for the first embodiment. The second embodiment thus displays similar advantages to the first embodiment.

[Third Embodiment]

Figure 30:
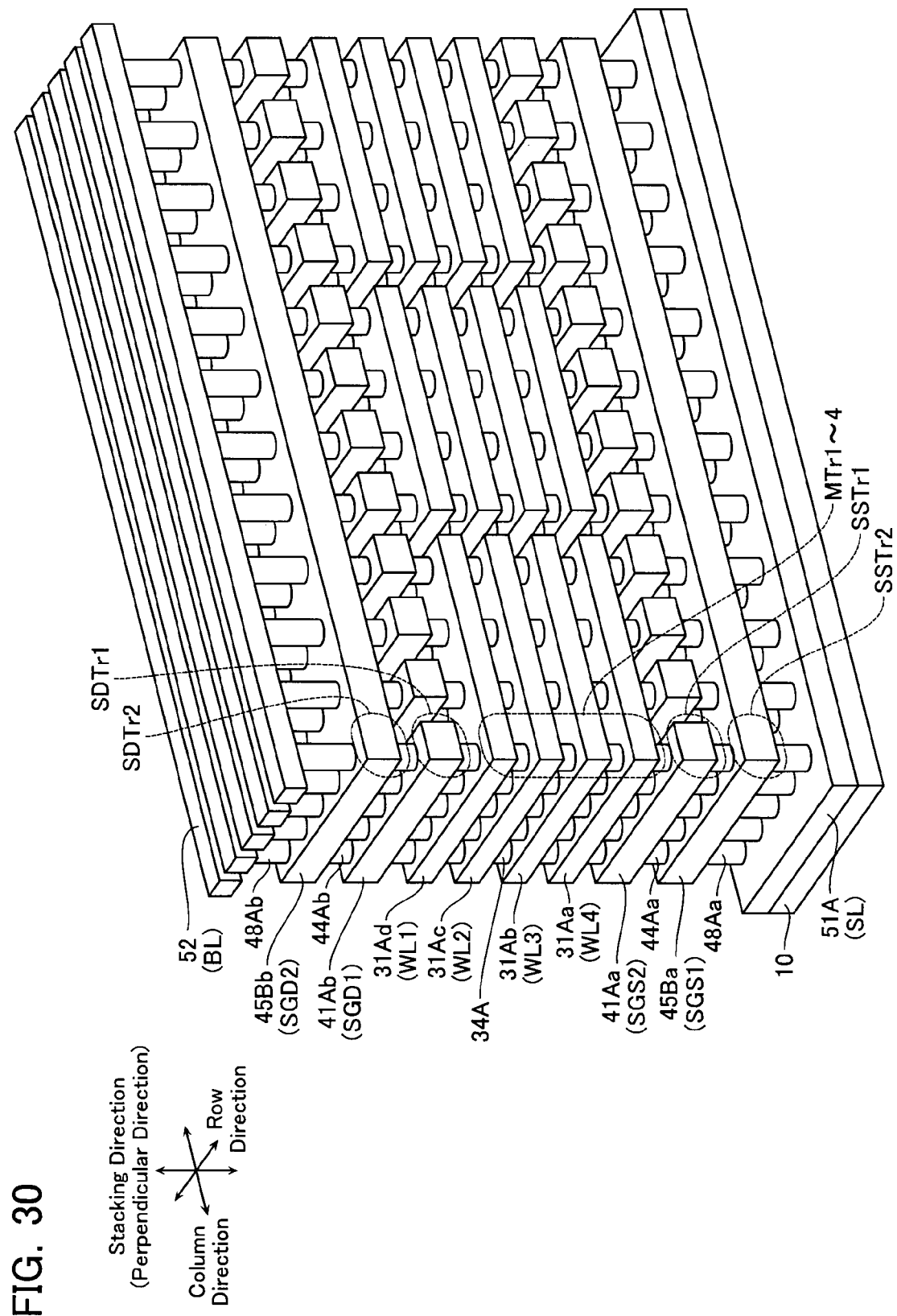
FIG. 30 is a perspective view showing a stacking structure of a nonvolatile semiconductor memory device in accordance with a third embodiment.

Next, a nonvolatile semiconductor memory device in accordance with a third embodiment is described with reference to FIG. 30. FIG. 30 is a perspective view showing a stacking structure of the nonvolatile semiconductor memory device in accordance with the third embodiment. Note that in the third embodiment, identical symbols are assigned to configurations similar to those in the first and second embodiments and descriptions thereof are omitted.

As shown in FIG. 30, in the third embodiment, a second source side conductive layer 45Ba is formed in a rectangular plate shape surrounding a plurality of second source side columnar semiconductor layers 48Aa aligned in the row direction and the column direction on a memory block MB basis. Moreover, a second drain side conductive layer 45Bb is formed in a rectangular plate shape surrounding a plurality of second drain side columnar semiconductor layers 48Ab aligned in the row direction and the column direction on a memory block MB basis. This allows manufacturing processes in the third embodiment to be simplified more than in the second embodiment.

The nonvolatile semiconductor memory device in accordance with the third embodiment executes similar operations to those of the flowchart shown in FIG. 8 for the first embodiment. The third embodiment thus displays similar advantages to the first embodiment.

[Other Embodiments]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

For example, in the above-described embodiments, an erase operation is performed on the second drain side select transistors SDTr2 and second source side select transistors SSTr2 in step S106, thereby executing an operation to change these transistors SDTr2 and SSTr2 from E type to D type. However, the present invention may omit the treatment of step S106 and leave the second drain side select transistors SDTr2 and second source side select transistors SSTr2 in E type. In this case, when for example a read operation is subsequently executed, the control circuit AR2 must apply a positive voltage not only to the first drain side select transistors SDTr1 and first source side select transistors SSTr1, but also to the second drain side select transistors SDTr2 and second source side select transistors SSTr2. However, the time required for the overwrite operation of the first drain side select transistors SDTr1 and first source side select transistors SSTr1 can nevertheless be reduced by an amount corresponding to step S106 being omitted.

What is claimed is:

1. A nonvolatile semiconductor memory device, comprising:
    a plurality of memory strings each including a plurality of memory transistors connected in series;
    a first transistor having one end connected to one end of one of the memory strings and functioning as a drain side select transistor of the one of the memory strings;
    a second transistor having one end connected to the other end of the first transistor;
    a third transistor having one end connected to the other end of the one of the memory strings and functioning as a source side select transistor of the one of the memory strings;
    a fourth transistor having one end connected to the other end of the third transistor;
    a bit line connected to the other end of the second transistor;
    a source line connected to the other end of the fourth transistor; and
    a control circuit configured to control a state of the memory strings, the first transistor, the second transistor, the third transistor, and the fourth transistor,
    each of the memory strings comprising:
    a first semiconductor layer including a first columnar portion extending in a perpendicular direction with respect to a substrate and functioning as a body of the memory transistors;
    a first charge storage layer surrounding the first columnar portion and changing a threshold voltage of the memory transistors by storing a charge; and
    a first conductive layer surrounding the first columnar portion with the first charge storage layer sandwiched therebetween, extending in parallel to the substrate, and functioning as a gate of the memory transistors, and
    the first through fourth transistors each comprising:
    a second semiconductor layer including a second columnar portion extending in the perpendicular direction with respect to the substrate and functioning as a body of the first through fourth transistors;
    a second charge storage layer surrounding the second columnar portion and changing a threshold voltage of the first through fourth transistors by storing a charge; and
    a second conductive layer surrounding the second columnar portion with the second charge storage layer sandwiched therebetween, extending in parallel to the substrate, and functioning as a gate of the first through fourth transistors,
    wherein
    in the case of performing an operation for increasing the threshold voltage of the first transistor or the third transistor, the control circuit is configured to apply a first voltage to the bit line, and apply a second voltage greater than the first voltage to a gate of the second transistor, thereby rendering the second transistor in a conductive state to transfer the first voltage to the second semiconductor layer, and then apply a program voltage to a gate of the first transistor or the third transistor to store a charge in the second charge storage layer, and
    in the case of leaving the threshold voltage of the first transistor or the third transistor unincreased, the control circuit is configured to apply the second voltage to the bit line, and apply the second voltage to the gate of the second transistor, thereby charging the first semiconductor layer and the second semiconductor layer to a certain voltage from the bit line via the second transistor and subsequently render the second transistor in a non-conductive state to maintain the first semiconductor layer and the second semiconductor layer in a floating state, and then, apply the program voltage to the gate of the first transistor or the third transistor to increase a voltage of the second semiconductor layer through coupling, thereby prohibiting storage of charge in the second charge storage layer.

2. The nonvolatile semiconductor memory device according to claim 1, wherein
    prior to executing the operation for increasing the threshold voltage of the first transistor or the third transistor, the control circuit is configured to increase the threshold voltage of the second transistor and the fourth transistor from a negative voltage to a positive voltage.

3. The nonvolatile semiconductor memory device according to claim 2, wherein
    subsequent to executing the operation for increasing the threshold voltage of the first transistor or the third transistor, the control circuit is configured to change the threshold voltage of the second transistor and the fourth transistor from the positive voltage back to the negative voltage.

4. The nonvolatile semiconductor memory device according to claim 1, wherein
    prior to executing the operation for increasing the threshold voltage of the first transistor or the third transistor, the control circuit is configured to perform an erase operation on the first transistor and the third transistor.

5. The nonvolatile semiconductor memory device according to claim 1, wherein
    the control circuit is configured to perform reading of the threshold voltage of the first transistor or the third transistor, and when the threshold voltage of the first transistor or the third transistor is of a certain value or less, the control circuit is configured to execute an operation for increasing the threshold voltage of the first transistor and the third transistor.

6. The nonvolatile semiconductor memory device according to claim 1, wherein
    a plurality of the second semiconductor layer are disposed in a matrix in a plane parallel to the substrate and are commonly connected to the second conductive layer.

7. The nonvolatile semiconductor memory device according to claim 6, wherein
    the second conductive layer functioning as the gate of the third or fourth transistors is formed in a comb-tooth shape or a rectangular plate shape in the plane parallel to the substrate.

8. The nonvolatile semiconductor memory device according to claim 1, wherein
the first semiconductor layer comprises a joining portion configured to join lower ends of a pair of first columnar portions.

9. The nonvolatile semiconductor memory device according to claim 2, wherein
the control circuit is configured to apply a third voltage to the source line and the bit line, and apply a fourth voltage higher than the third voltage to the gates of the second transistor and the fourth transistor, thereby increasing the threshold voltage of the second transistor and the fourth transistor from the negative voltage to the positive voltage.

10. The nonvolatile semiconductor memory device according to claim 3, wherein
the control circuit is configured to apply a fifth voltage to the source line and the bit line, and apply a sixth voltage lower than the fifth voltage to the gate of the second transistor or the fourth transistor, thereby changing the threshold voltage of the second transistor or the fourth transistor from the positive voltage back to the negative voltage.

11. The nonvolatile semiconductor memory device according to claim 4, wherein
the control circuit is configured to apply a seventh voltage to the source line and the bit line, and apply an eighth voltage lower than the seventh voltage to the gates of the first transistor and the third transistor, thereby performing the erase operation on the first transistor and the third transistor.

12. The nonvolatile semiconductor memory device according to claim 5, wherein
the control circuit is configured to apply a ninth voltage to the gates of the memory transistors, the gates of the second transistor and the fourth transistor, and any one of the gate of the first transistor or the third transistor, apply a tenth voltage lower than the ninth voltage to the others, apply an eleventh voltage to the bit line, and apply a twelfth voltage lower than the eleventh voltage to the source line, thereby reading the threshold voltage of the first transistor or the third transistor.

13. A nonvolatile semiconductor memory device, comprising:
a plurality of memory strings each including a plurality of memory transistors connected in series;
a first transistor having one end connected to one end of one of the memory strings and functioning as a drain side select transistor of the one of the memory strings;
a second transistor having one end connected to the other end of the first transistor;
a third transistor having one end connected to the other end of the one of the memory strings and functioning as a source side select transistor of the one of the memory strings;
a fourth transistor having one end connected to the other end of the third transistor;
a bit line connected to the other end of the second transistor;
a source line connected to the other end of the fourth transistor; and
a control circuit configured to control a state of the memory strings, the first transistor, the second transistor, the third transistor, and the fourth transistor,
each of the memory strings comprising:
a first semiconductor layer including a first columnar portion extending in a perpendicular direction with respect to a substrate and functioning as a body of the memory transistors;
a first charge storage layer surrounding the first columnar portion and changing a threshold voltage of the memory transistors by storing a charge; and
a first conductive layer surrounding the first columnar portion with the first charge storage layer sandwiched therebetween, extending in parallel to the substrate, and functioning as a gate of the memory transistors, and
the first through fourth transistors each comprising:
a second semiconductor layer including a second columnar portion extending in the perpendicular direction with respect to the substrate and functioning as a body of the first through fourth transistors;
a second charge storage layer surrounding the second columnar portion and changing a threshold voltage of the first through fourth transistors by storing a charge; and
a second conductive layer surrounding the second columnar portion with the second charge storage layer sandwiched therebetween, extending in parallel to the substrate, and functioning as a gate of the first through fourth transistors,
wherein
prior to executing an operation for increasing the threshold voltage of the first transistor or the third transistor, the control circuit is configured to increase the threshold voltage of the second transistor and the fourth transistor from a negative voltage to a positive voltage.

14. The nonvolatile semiconductor memory device according to claim 13, wherein
subsequent to executing the operation for increasing the threshold voltage of the first transistor or the third transistor, the control circuit is configured to change the threshold voltage of the second transistor and the fourth transistor from the positive voltage back to the negative voltage.

15. The nonvolatile semiconductor memory device according to claim 13, wherein
prior to executing the operation for increasing the threshold voltage of the first transistor or the third transistor, the control circuit is configured to performs an erase operation on the first transistor and the third transistor.

16. The nonvolatile semiconductor memory device according to claim 13, wherein
the control circuit is configured to perform reading of the threshold voltage of the first transistor or the third transistor, and when the threshold voltage of the first transistor or the third transistor is of a certain value or less, the control circuit is configured to execute an operation for increasing the threshold voltage of the first transistor and the third transistor.

17. The nonvolatile semiconductor memory device according to claim 13, wherein
a plurality of the second semiconductor layer are disposed in a matrix in a plane parallel to the substrate and are commonly connected to the second conductive layer.

18. The nonvolatile semiconductor memory device according to claim 17, wherein
the second conductive layer functioning as the gate of the third or fourth transistors is formed in a comb-tooth shape or a rectangular plate shape in the plane parallel to the substrate.

19. The nonvolatile semiconductor memory device according to claim 13, wherein
the first semiconductor layer comprises a joining portion configured to join lower ends of a pair of first columnar portions.

* * * * *